(12) United States Patent
Kawashima

(10) Patent No.: US 8,144,967 B2
(45) Date of Patent: Mar. 27, 2012

(54) MASK DATA GENERATION METHOD, MASK FABRICATION METHOD, EXPOSURE METHOD, DEVICE FABRICATION METHOD, AND STORAGE MEDIUM

(75) Inventor: Miyoko Kawashima, Haga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 779 days.

(21) Appl. No.: 12/210,547

(22) Filed: Sep. 15, 2008

(65) Prior Publication Data

US 2009/0074287 A1   Mar. 19, 2009

(30) Foreign Application Priority Data

Sep. 19, 2007  (JP) ................................ 2007-242911
Feb. 22, 2008  (JP) ................................ 2008-041489

(51) Int. Cl.
*G03F 1/02* (2011.01)
(52) U.S. Cl. ............ 382/141; 382/144; 430/5; 430/322; 355/53; 355/77
(58) Field of Classification Search .................. 382/141, 382/144, 149, 224; 430/5, 322, 325; 355/53, 355/77
See application file for complete search history.

(56) References Cited

U.S. PATENT DOCUMENTS

| 7,247,574 B2* | 7/2007 | Broeke et al. .................. 438/725 |
| 7,376,930 B2* | 5/2008 | Wampler et al. ................. 716/54 |
| 7,550,235 B2* | 6/2009 | Shi et al. ............................ 430/5 |
| 7,620,930 B2* | 11/2009 | Van Den Broeke et al. .... 716/53 |
| 7,774,736 B2* | 8/2010 | Broeke et al. .................. 716/53 |
| 2004/0142251 A1 | 7/2004 | Hsu et al. |
| 2004/0229133 A1 | 11/2004 | Socha et al. |
| 2005/0142470 A1 | 6/2005 | Socha et al. |
| 2006/0075377 A1 | 4/2006 | Broeke et al. |
| 2006/0281016 A1 | 12/2006 | O'Brien |

FOREIGN PATENT DOCUMENTS

| EP | 1494070 A2 | 1/2005 |
| EP | 1513012 A2 | 3/2005 |
| JP | 2004-221594 A | 8/2004 |
| WO | 02/073506 A | 9/2002 |
| WO | 2007/041135 A1 | 4/2007 |
| WO | 2008/151185 A | 12/2008 |

OTHER PUBLICATIONS

European Search Report issued on Jan. 26, 2009 for European Patent Application No. 08163469.

(Continued)

*Primary Examiner* — Layla Lauchman
(74) *Attorney, Agent, or Firm* — Canon, U.S.A., Inc. IP Division

(57) ABSTRACT

The invention provides a generation method of generating data of a mask, comprising a calculation step of calculating an aerial image formed on an image plane of a projection optical system, an extraction step of extracting a two-dimensional image from the aerial image, a determination step of determining a main pattern of the mask based on the two-dimensional image, an extraction step of extracting, from the aerial image, a peak portion at which a light intensity takes a peak value in a region other than a region in which the main pattern is projected, a determination step of determining an assist pattern based on the light intensity of the peak portion, and a generation step of inserting the assist pattern into a portion of the mask, which corresponds to the peak portion, thereby generating, as the data of the mask, pattern data including the assist pattern and the main pattern.

14 Claims, 24 Drawing Sheets

OTHER PUBLICATIONS

R. Socha, et al., Contact Hole Reticle Optimization by Using Interference Mapping Lithography (IML), Proceedings of the SPIE, Nov. 22, 2004, vol. 5446, pp. 516-534.

M. Born et al., Principles of Optics (Chapter X) $7^{th}$ Edition, 1999, pp. 554-632, Cambridge University Press, United Kingdom.

* cited by examiner

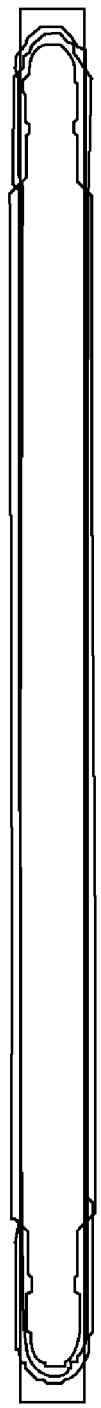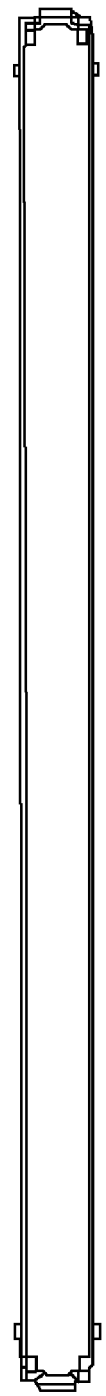
F I G. 7A   F I G. 7B

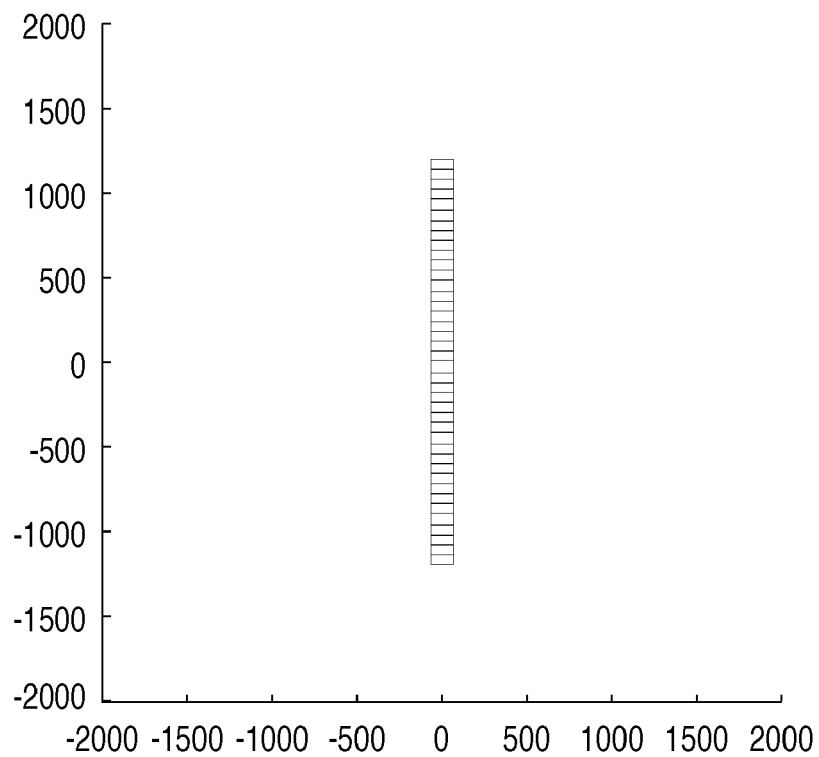
F I G. 8A
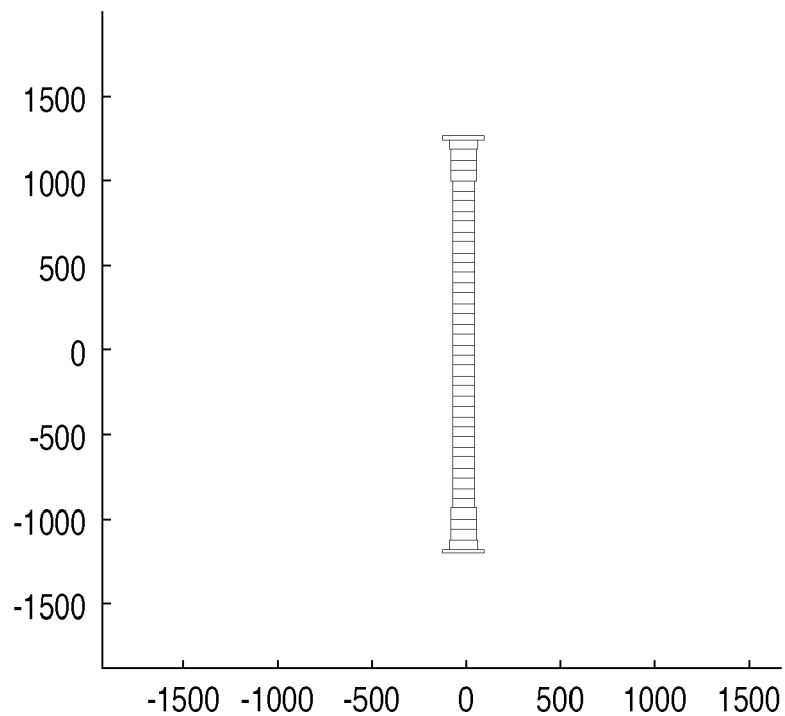
F I G. 8B

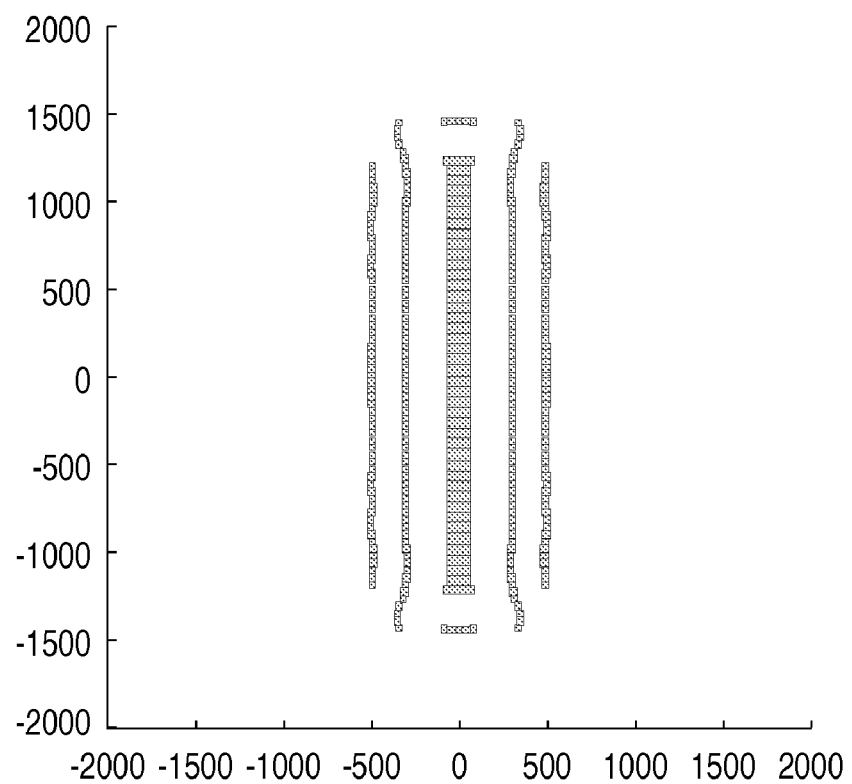
F I G. 9
F I G. 10

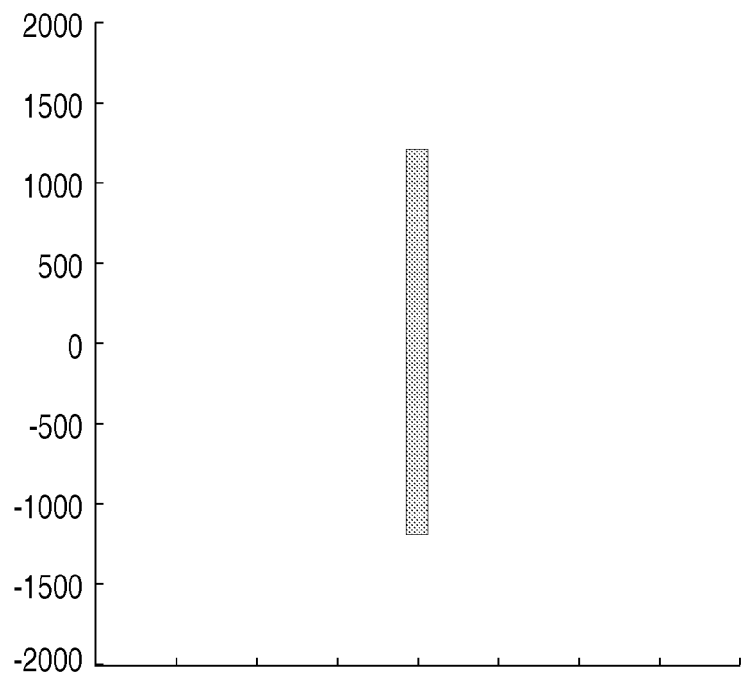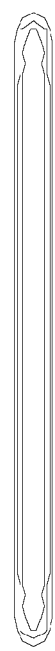
F I G. 11A    F I G. 11B
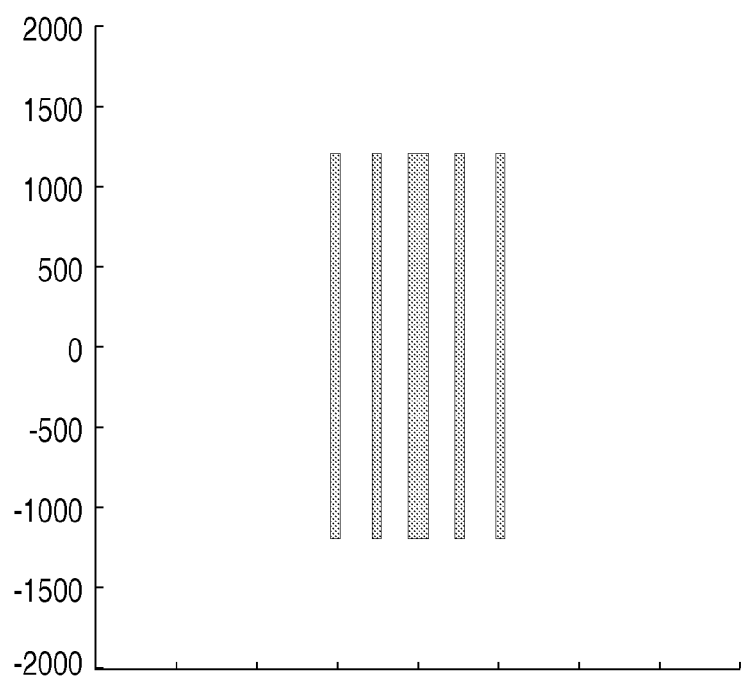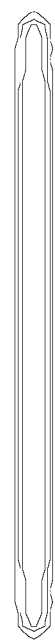
F I G. 12A    F I G. 12B

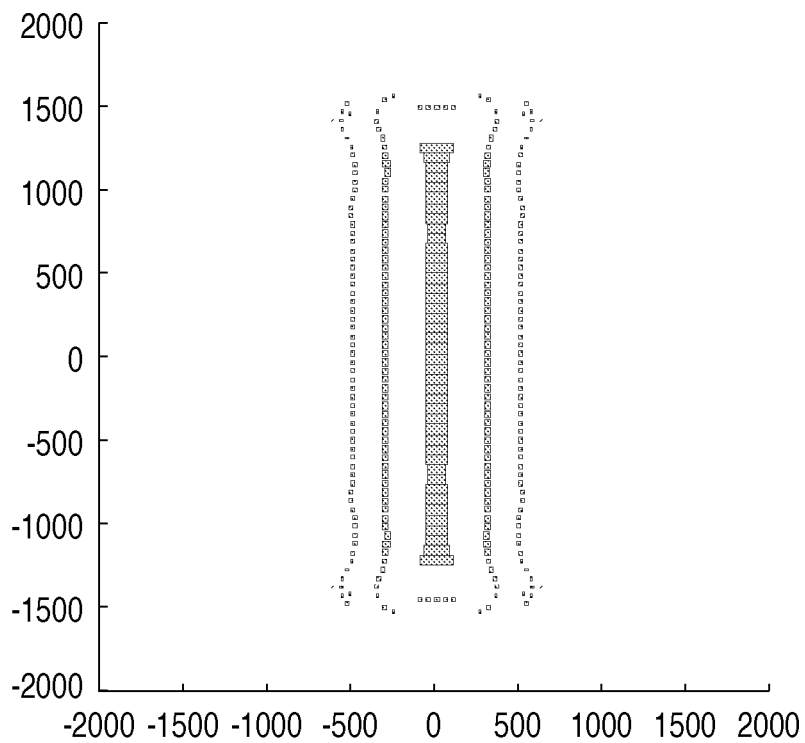
F I G. 18A
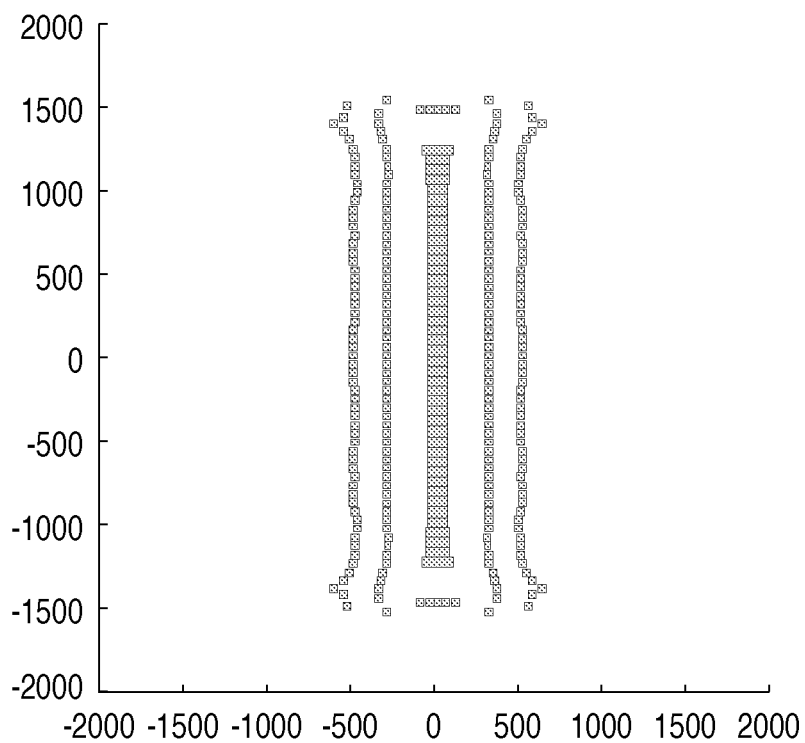
F I G. 18B

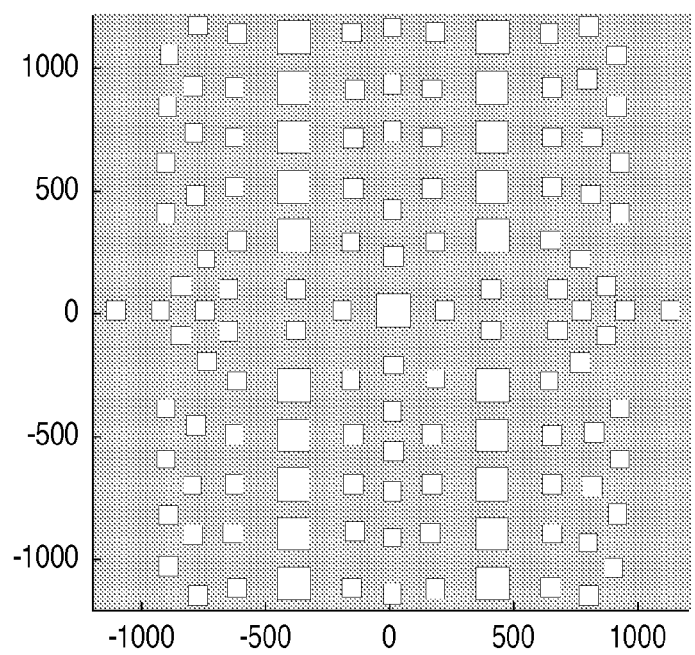
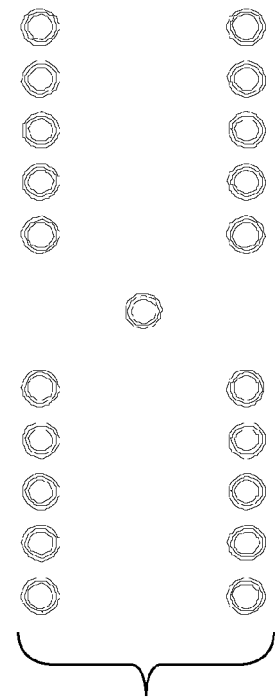
F I G. 22
F I G. 23
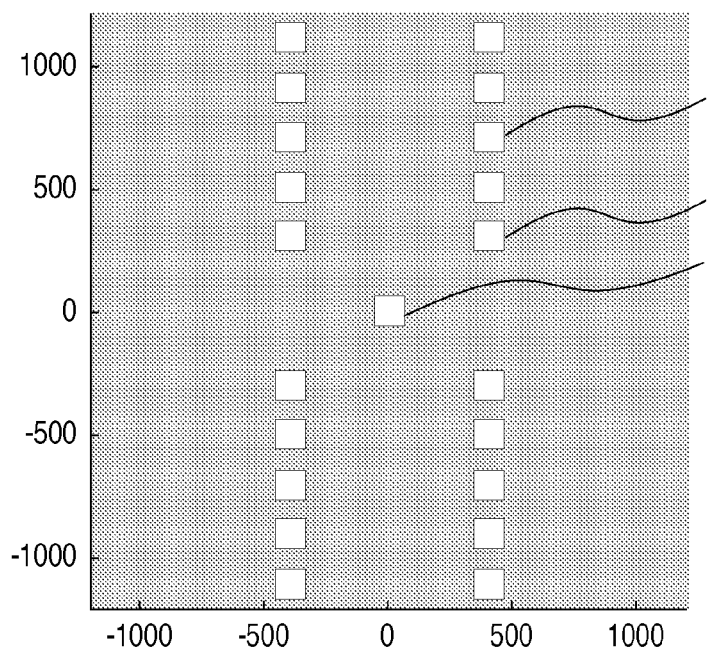
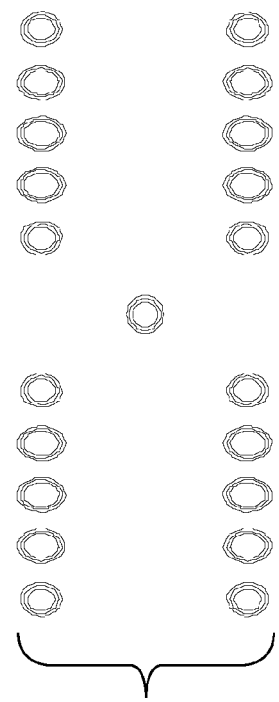
F I G. 24A
F I G. 24B

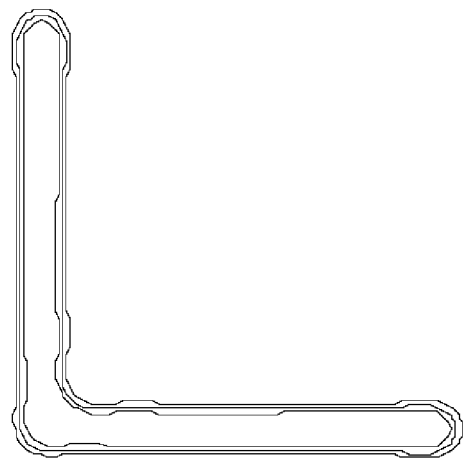
F I G. 37A
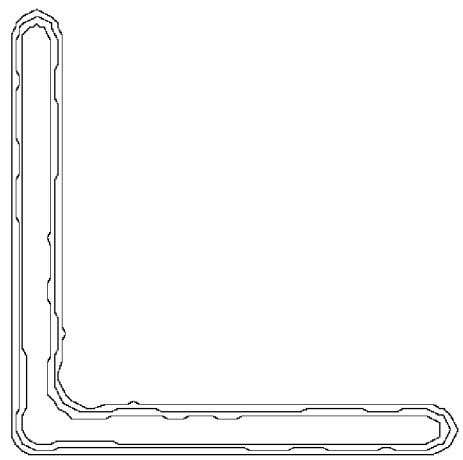
F I G. 37B

MASK DATA GENERATION METHOD, MASK FABRICATION METHOD, EXPOSURE METHOD, DEVICE FABRICATION METHOD, AND STORAGE MEDIUM

BACKGROUND OF THE INVENTION

1. Field of the Invention

The present invention relates to a mask data generation method, a mask fabrication method, an exposure method, a device fabrication method, and a storage medium.

2. Description of the Related Art

An exposure apparatus is employed to fabricate, for example, a micropatterned semiconductor device such as a semiconductor memory or logic circuit by using photolithography. The exposure apparatus projects and transfers a circuit pattern formed on a mask (reticle) onto a substrate such as a wafer by a projection optical system. Along with the recent advance in the micropatterning of semiconductor devices, it is becoming necessary for an exposure apparatus to form a pattern having a line width smaller than the exposure wavelength (the wavelength of the exposure light). However, the influence of light diffraction conspicuously appears in such a micropattern, so the pattern contour (pattern shape) is not formed on the wafer intact. For example, the pattern corners are rounded or the pattern length shortens.

In recent years, to reduce deterioration in the shape precision of a pattern formed on the wafer, a mask pattern is designed by pattern shape correction processing (the so-called OPC (Optical Proximity Correction)). The OPC corrects the pattern shape in accordance with a rule-based system or a model-based system using optical simulation by taking account of the influence of the shape of each element of the mask pattern and its peripheral elements.

The model-based system using optical simulation deforms the mask pattern until a desired optical image is obtained. A method of inserting assist feature small enough not to be resolved has also been proposed.

Techniques of deriving how to insert assist patterns by numerical calculation are disclosed in Japanese Patent Laid-Open No. 2004-221594 (patent reference 1), and Robert Socha, Douglas Van Den Broeke, Stephen Hsu, J. Fung Chen, Tom Laidig, Noel Corcoran, Uwe Hollerbach, Kurt E. Wampler, Xuelong Shi, and Will Conley, "Contact Hole Reticle Optimization by Using Interference Mapping Lithography (IML™)", Proceedings of SPIE, U.S.A., SPIE press, 2005, Vol. 5853, pp. 180-193. These techniques obtain an interference map by numerical calculation, thereby deriving a position where interference is caused on the mask and a position where interference is canceled on the mask. In the position on the interference map where interference is caused, an assist pattern is inserted so that the phase of exposure light having passed through the main pattern to be transferred and the phase of an exposure light having passed through the assist pattern are equal to each other. At the position the interference map where interference is canceled, an assist pattern is inserted so that the phase of the exposure light having passed through the main pattern and the phase of the exposure light having passed through the assist pattern have a difference of 180 degrees. As a result, the main pattern to be transferred and the assist pattern strongly interfere with each other, whereby the main pattern can be exposed successfully. The above-described interference map represents light amplitude on an image plane that is positioned in an imaging relation to a mask plane. The main pattern is an element which exists on the mask and is transferred onto the wafer.

Circuit patterns can be roughly classified into a line pattern and a contact hole pattern.

The technique disclosed in patent reference 1 calculates assist patterns by assumption that a line pattern equals a one-dimensional line and contact hole pattern equals a dimensionless point. So it cannot calculate the shape of the main pattern. To cope with this situation, the main pattern must be newly calculated after calculating, for example, the positions, shapes, and sizes of the assist patterns. It is a common practice to perform the optical proximity correction for the main pattern by calculating its specifications not from an approximate aerial image but from a non-approximate aerial image in accordance with a model-based system. In view of this, patent reference 1 requires a large number of times of calculation of non-approximate aerial images to obtain a mask pattern including the main pattern and assist patterns, which takes a long calculation time.

Also, patent reference 1 is not precision in an estimate of the interaction of the optical proximity effect between the main pattern and the assist patterns because the main pattern is assumed by a line or point in calculating the assist patterns. The corrected main pattern which is obtained later causes the optical proximity effect for the assist patterns which is obtained earlier. Consequently, a predicted effect of the assist patterns may not be obtained or the assist patterns may have an adverse effect on the obtained mask pattern. Particularly when a line pattern is used as the main pattern, assist pattern insertion is very difficult because a change of its shape due to the optical proximity correction is large at its line edge portion and curved portion.

SUMMARY OF THE INVENTION

The present invention provides a generation method of generating data on a mask which forms a micro pattern with high precision.

According to the first aspect of the present invention, there is provided a generation method of generating, by a computer, data of a mask used for an exposure apparatus which comprises an illumination optical system which illuminates the mask with light from a light source, and a projection optical system which projects a pattern of the mask onto a substrate, comprising an aerial image calculation step of calculating an aerial image formed on an image plane of the projection optical system, based on information associated with a light intensity distribution formed on a pupil plane of the projection optical system by the illumination optical system, information associated with a wavelength of the light from the light source, information associated with a numerical aperture of the projection optical system on a side of the image plane thereof, and a target pattern to be formed on the substrate, a two-dimensional image extraction step of extracting a two-dimensional image from the aerial image calculated in the aerial image calculation step, a main pattern determination step of determining a main pattern of the mask based on the two-dimensional image extracted in the two-dimensional image extraction step, a peak portion extraction step of extracting, from the aerial image calculated in the aerial image calculation step, a peak portion at which a light intensity takes a peak value in a region other than a region in which the main pattern is projected onto the image plane, an assist pattern determination step of determining an assist pattern based on the light intensity of the peak portion extracted in the peak portion extraction step, and a generation step of inserting the assist pattern determined in the assist pattern determination step into a portion of the mask, which corresponds to the peak portion extracted in the peak portion extraction step, thereby generating, as the data of the mask, pattern data including the assist pattern and the main pattern determined in the main pattern determination step.

According to the second aspect of the present invention, there is provided a generation method of generating, by a computer, data of a mask used for an exposure apparatus which comprises an illumination optical system which illuminates the mask with light from a light source, and a projection optical system which projects a pattern of the mask onto a substrate, comprising a first aerial image calculation step of calculating an aerial image formed on an image plane of the projection optical system, based on information associated with a light intensity distribution formed on a pupil plane of the projection optical system by the illumination optical system, information associated with a wavelength of the light from the light source, information associated with a numerical aperture of the projection optical system on a side of the image plane thereof, and a target pattern to be formed on the substrate, a first two-dimensional image extraction step of extracting a two-dimensional image from the aerial image calculated in the first aerial image calculation step, a first main pattern determination step of determining a main pattern of the mask based on the two-dimensional image extracted in the first two-dimensional image extraction step, a first peak portion extraction step of extracting, from the aerial image calculated in the first aerial image calculation step, a peak portion at which a light intensity takes a peak value in a region other than a region in which the main pattern is projected onto the image plane, a first assist pattern determination step of determining an assist pattern based on the light intensity of the peak portion extracted in the first peak portion extraction step, a second aerial image calculation step of calculating an aerial image formed on the image plane of the projection optical system, based on a pattern including the main pattern determined in the first main pattern determination step and the assist pattern which is determined in the first assist pattern determination step and inserted at a portion of the mask, which corresponds to the peak portion extracted in the first peak portion extraction step, the information associated with the light intensity distribution formed on the pupil plane of the projection optical system by the illumination optical system, the information associated with the wavelength of the light from the light source, and the information associated with the numerical aperture of the projection optical system on the side of the image plane thereof, a second two-dimensional image extraction step of extracting a two-dimensional image from the aerial image calculated in the second aerial image calculation step, a second main pattern determination step of determining a main pattern of the mask based on the two-dimensional image extracted in the second two-dimensional image extraction step, a second peak portion extraction step of extracting, from the aerial image calculated in the second aerial image calculation step, a peak portion at which a light intensity takes a peak value in a region other than a region in which the main pattern is projected onto the image plane, a second assist pattern determination step of determining an assist pattern based on the light intensity of the peak portion extracted in the second peak portion extraction step, and a generation step of inserting the assist pattern determined in the second assist pattern determination step into a portion of the mask, which corresponds to the peak portion extracted in the second peak portion extraction step, thereby generating, as the data of the mask, pattern data including the assist pattern and the main pattern determined in the second main pattern determination step.

According to the third aspect of the present invention, there is provided a mask fabrication method comprising fabricating a mask based on data generated by the above generation method.

According to the fourth aspect of the present invention, there is provided an exposure method comprising steps of fabricating a mask by the above mask fabrication method, illuminating the fabricated mask, and projecting an image of a pattern of the mask onto a substrate via a projection optical system.

According to the fifth aspect of the present invention, there is provided a device fabrication method comprising steps of exposing a substrate using the above exposure method, and performing a development process for the substrate exposed.

According to the sixth aspect of the present invention, there is provided a storage medium which stores a program for making a computer generate data of a mask used for an exposure apparatus which comprises an illumination optical system which illuminates the mask with light from a light source, and a projection optical system which projects a pattern of the mask onto a substrate, the medium making the computer execute an aerial image calculation step of calculating an aerial image formed on an image plane of the projection optical system, based on information associated with a light intensity distribution formed on a pupil plane of the projection optical system by the illumination optical system, information associated with a wavelength of the light from the light source, information associated with a numerical aperture of the projection optical system on a side of the image plane thereof, and a target pattern to be formed on the substrate, a two-dimensional image extraction step of extracting a two-dimensional image from the aerial image calculated in the aerial image calculation step, a main pattern determination step of determining a main pattern of the mask based on the two-dimensional image extracted in the two-dimensional image extraction step, a peak portion extraction step of extracting, from the aerial image calculated in the aerial image calculation step, a peak portion at which a light intensity takes a peak value in a region other than a region in which the main pattern is projected onto the image plane, an assist pattern determination step of determining an assist pattern based on the light intensity of the peak portion extracted in the peak portion extraction step, and a generation step of inserting the assist pattern determined in the assist pattern determination step into a portion of the mask, which corresponds to the peak portion extracted in the peak portion extraction step, thereby generating, as the data of the mask, pattern data including the assist pattern and the main pattern determined in the main pattern determination step.

According to the seventh aspect of the present invention, there is provided a storage medium which stores a program for making a computer generate data of a mask used for an exposure apparatus which comprises an illumination optical system which illuminates the mask with light from a light source, and a projection optical system which projects a pattern of the mask onto a substrate, the medium making the computer execute a first aerial image calculation step of calculating an aerial image formed on an image plane of the projection optical system, based on information associated with a light intensity distribution formed on a pupil plane of the projection optical system by the illumination optical system, information associated with a wavelength of the light from the light source, information associated with a numerical aperture of the projection optical system on a side of the image plane thereof, and a target pattern to be formed on the substrate, a first two-dimensional image extraction step of extracting a two-dimensional image from the aerial image calculated in the first aerial image calculation step, a first main pattern determination step of determining a main pattern of the mask based on the two-dimensional image extracted in the first two-dimensional image extraction step a first peak portion extraction step of extracting, from the aerial image calculated in the first aerial image calculation step, a peak portion at which a light intensity takes a peak value in a region other than a region in which the main pattern is projected onto the image plane, a first assist pattern determination step of determining an assist pattern based on the light intensity of the peak portion extracted in the first peak portion extraction step, a second aerial image calculation step of calculating an aerial image formed on the image plane of the projection optical system, based on a pattern including the main pattern determined in the first main pattern determination step and the assist pattern which is determined in the first assist pattern determination step and inserted at a portion of the mask, which corresponds to the peak portion extracted in the first peak portion extraction step, the information associated with the light intensity distribution formed on the pupil plane of the projection optical system by the illumination optical system, the information associated with the wavelength of the light from the light source, and the information associated with the numerical aperture of the projection optical system on the side of the image plane thereof, a second two-dimensional image extraction step of extracting a two-dimensional image from the aerial image calculated in the second aerial image calculation step, a second main pattern determination step of determining a main pattern of the mask based on the two-dimensional image extracted in the second two-dimensional image extraction step, a second peak portion extraction step of extracting, from the aerial image calculated in the second aerial image calculation step, a peak portion at which a light intensity takes a peak value in a region other than a region in which the main pattern is projected onto the image plane, a second assist pattern determination step of determining an assist pattern based on the light intensity of the peak portion extracted in the second peak portion extraction step, and a generation step of inserting the assist pattern determined in the second assist pattern determination step into a portion of the mask, which corresponds to the peak portion extracted in the second peak portion extraction step, thereby generating, as the data of the mask, pattern data including the assist pattern and the main pattern determined in the second main pattern determination step.

Further features of the present invention will become apparent from the following description of exemplary embodiments with reference to the attached drawings.

BRIEF DESCRIPTION OF THE DRAWINGS

FIGS. 7A and 7B are views showing two-dimensional images extracted from the approximate aerial images shown in FIGS. 6A and 6B.

FIGS. 8A and 8B are charts for explaining the deformation of the pattern data (main pattern).

FIG. 9 is a chart showing pattern data obtained by inserting assist patterns into the main pattern in the first embodiment.

FIG. 10 is a view showing a two-dimensional image of a precise aerial image obtained from the pattern data shown in FIG. 9.

FIG. 11A is a chart showing the target pattern according to the first embodiment.

FIG. 11B is a view showing a two-dimensional image of an aerial image calculated from the target pattern shown in FIG. 11A.

FIG. 12A is a chart showing a pattern obtained by inserting scattering bars into the target pattern according to the first embodiment.

FIG. 12B is a view showing a two-dimensional image of an aerial image calculated from the pattern shown in FIG. 12A.

FIGS. 18A and 18B are charts showing pattern data obtained by changing the sizes of the assist patterns in the pattern data shown in FIG. 9.

FIG. 22 is a chart showing pattern data obtained by inserting assist patterns into the main pattern in the second embodiment.

FIG. 23 is a view showing a two-dimensional image of a precise aerial image obtained from the pattern data shown in FIG. 22.

FIG. 24A is a chart showing the target patterns according to the second embodiment.

FIG. 24B is a view showing a two-dimensional image of an aerial image calculated from the target patterns shown in FIG. 24A.

FIG. 37A is a view showing a precise aerial image obtained from the mask pattern shown in FIG. 36.

FIG. 37B is a view showing a precise aerial image upon defocusing.

DESCRIPTION OF THE EMBODIMENTS

Figure 1:
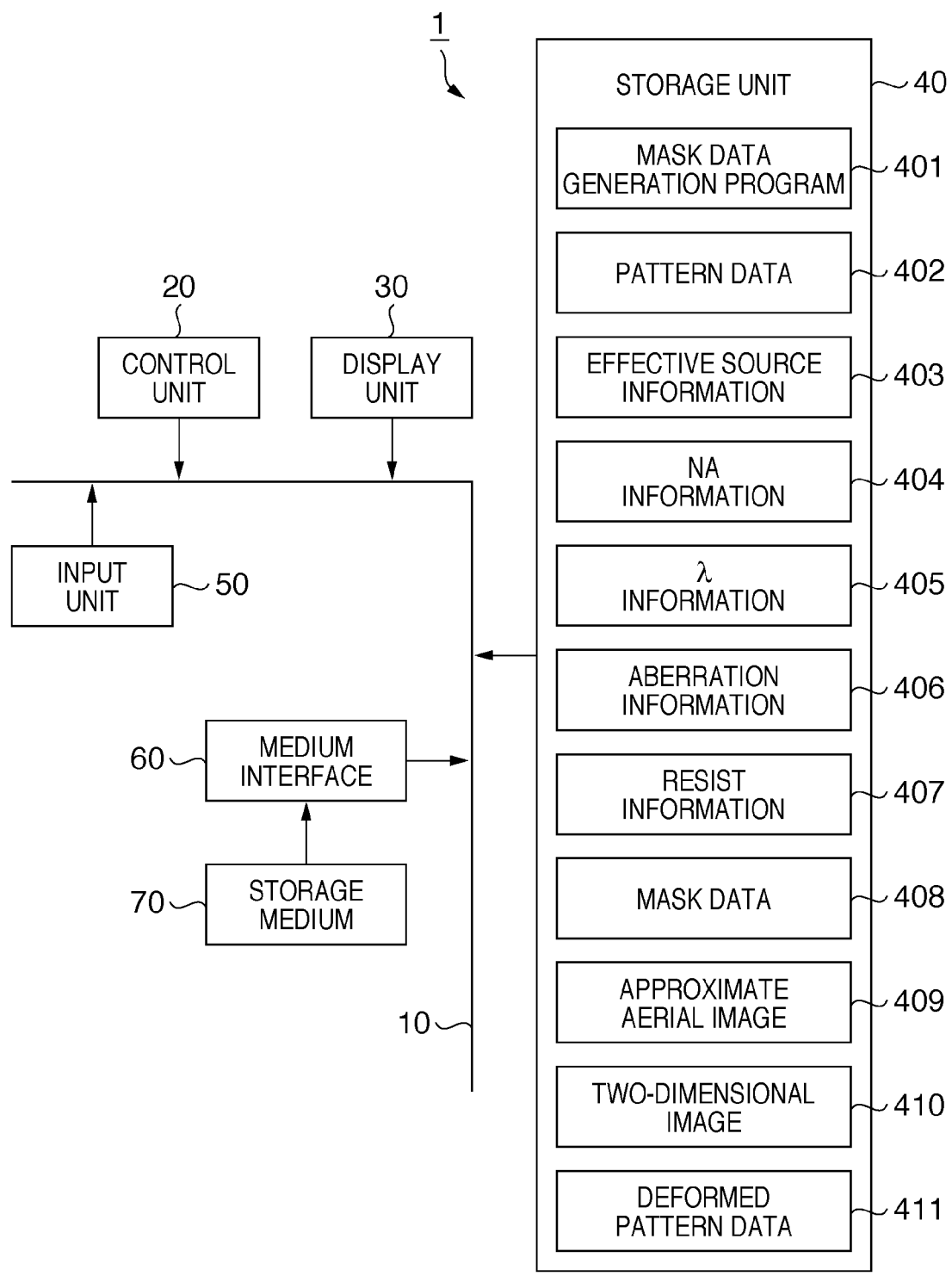
FIG. 1 is a schematic block diagram showing the configuration of a processing apparatus which executes a generation method according to one aspect of the present invention.

Preferred embodiments of the present invention will be described below with reference to the accompanying drawings. The same reference numerals denote the same members throughout the drawings, and a repetitive description thereof will not be given.

The present invention is applicable in generating data of a mask (mask pattern) used in micromechanics and in fabricating various devices, for example, semiconductor chips such as an IC and LSI, a display device such as a liquid crystal panel, a detection device such as a magnetic head, and an image sensing device such as a CCD. The micromechanics herein means a technique of fabricating a micrometer-order sophisticated machinery system by applying a semiconductor integrated circuit fabrication technique to the fabrication of a microstructure, or the machinery system itself. For example, the present invention is suitable to generate data of a mask (mask pattern) used for an exposure apparatus having a projection optical system with a high numerical aperture (NA), and an immersion exposure apparatus in which the space between a projection optical system and a wafer is filled with a liquid.

The concept disclosed in the present invention can be modeled mathematically. Hence, the present invention can be implemented as a software function of a computer system.

A software function of a computer system includes programming having executable software codes, and can generate data of a mask which forms a micropattern with high precision. The software codes are executed by the processor of the computer system. Codes or associated data records are stored in the computer platform during the software code operation. However, the software codes are often stored in other sites or loaded into an appropriate computer system. The software codes can be held on at least one computer-readable recording medium as one or a plurality of modules. The contents of the present invention are described in the form of codes described above, which can function as one or a plurality of software products.

FIG. 1 is a schematic block diagram showing the configuration of a processing apparatus 1 which executes a generation method according to one aspect of the present invention. This generation method is used to generate mask data.

The processing apparatus 1 is formed from, for example, a general-purpose computer, and includes a bus line 10, control unit 20, display unit 30, storage unit 40, input unit 50, and medium interface 60, as shown in FIG. 1.

The bus line 10 interconnects the control unit 20, display unit 30, storage unit 40, input unit 50, and medium interface 60.

The control unit 20 is formed from a CPU, GPU, DSP, or microcomputer, and includes a cash memory for temporal storage. Based on a start-up instruction of a mask data generation program 401, which is input by the user via the input unit 50, the control unit 20 starts up and executes the mask data generation program 401 stored in the storage unit 40. Using the data stored in the storage unit 40, the control unit 20 performs arithmetic processing involved in a mask data generation method (to be described later).

The display unit 30 is formed from, for example, a display device such as a CRT display or liquid crystal display. The display unit 30 displays, for example, information associated with the execution of the mask data generation program 401 (e.g., a two-dimensional image 410 of an approximate aerial image (to be described later), and mask data 408).

The storage unit 40 is formed from, for example, a memory or hard disk. The storage unit 40 stores the mask data generation program 401 provided from a storage medium 70 connected to the medium interface 60.

The storage unit 40 stores pattern data 402, effective source information 403, NA information 404, λ information 405, aberration information 406, and resist information 407 as pieces of information input in executing the mask data generation program 401. The storage unit 40 also stores mask data 408 as information output after executing the mask data generation program 401. The storage unit 40 also stores an approximate aerial image 409, a two-dimensional image 410 of the approximate aerial image, and deformed pattern data (main pattern and assist (auxiliary) patterns) 411 as pieces of information temporarily stored during the execution of the mask data generation program 401.

The mask data generation program 401 is used to generate mask data 408 representing data on, for example, the pattern of a mask used for the exposure apparatus or a pattern formed by a pattern forming unit of a spatial light modulator (SLM). In this case, pattern elements are formed as polygon, and a collection of them constitutes the entire mask pattern.

The pattern data 402 is data on a pattern laid out in designing, for example, an integrated circuit (a desired pattern which is formed on a wafer, and will be referred to as a layout pattern or target pattern hereinafter).

The effective source information 403 is associated with polarization and a light intensity distribution (effective source) formed on the pupil plane of the projection optical system of the exposure apparatus.

The NA information 404 is associated with the numerical aperture (NA), on the image plane side, of the projection optical system of the exposure apparatus.

The λ information 405 is associated with the wavelength of light (exposure light) emitted by a light source of the exposure apparatus.

The aberration information 406 is associated with the aberration of the projection optical system of the exposure apparatus.

The resist information 407 is associated with a resist applied on the wafer.

The mask data 408 represents the pattern of an actual mask, which is generated by executing the mask data generation program 401.

The approximate aerial image 409 is generated during the execution of the mask data generation program 401, and represents the distribution of an approximate aerial image formed by interference between the main diffracted light beams on the wafer surface.

The two-dimensional image 410 is generated during the execution of the mask data generation program 401, and is equivalent to the one obtained by cutting the approximate aerial image 409 in accordance with a reference slice value.

The deformed pattern data 411 includes the main pattern deformed by executing the mask data generation program 401, and assist patterns inserted by executing the mask data generation program 401.

The pattern data 402, mask data 408, and deformed pattern data 411 include pieces of information on, for example, the positions, sizes, shapes, transmittances, and phases of the main pattern and assist patterns. The pattern data 402, mask data 408, and deformed pattern data 411 also include pieces of information on, for example, the transmittance and phase of a region in which neither the main pattern nor assist patterns exist (background).

The input unit 50 includes, for example, a keyboard and mouse. The user can input, for example, pieces of input information on the mask data generation program 401 via the input unit 50.

The medium interface 60 includes, for example, a Floppy® disk drive, CD-ROM drive, and USB interface, and can be connected to the storage medium 70. The storage medium 70 includes, for example, a Floppy® disk, CD-ROM, and USB memory, and provides the mask data generation program 401 and other programs executed by the processing apparatus 1.

Processing of generating mask data by executing the mask data generation program by the control unit 20 of the processing apparatus 1 will be explained with reference to FIG. 2.

In step S102, the control unit 20 calculates the approximate aerial image (i.e., the approximate aerial image of the target pattern) based on pieces of information (pattern data, effective source information, NA information, λ information, aberration information, and resist information). Note that the pieces of input information (pattern data, effective source information, NA information, λ information, aberration information, and resist information) are input by the user via the input unit 50, and stored in the storage unit 40.

There are two reasons why an approximate aerial image is calculated without calculating a precise aerial image in step S102. First, the time taken to calculate an approximate aerial image is considerably shorter than that taken to calculate a precise aerial image. Second, the approximate aerial image enhances the pattern coherency and therefore clearly shows the optical proximity effect.

Various approximate aerial image calculation methods have been disclosed conventionally. For example, the approximate aerial image can be calculated by deforming the interference map disclosed in patent reference 1. In this case, singular value decomposition is performed for a TCC (Transmission Cross Coefficient). Let $\lambda_i$ be the i-th eigenvalue, and $\Phi_i(f,g)$ be the i-th eigenfunction. Note that (f,g) is the coordinates on the pupil plane of the projection optical system. The TCC represents the coherency of the effective source (the degree of coherence according to the distance on the mask surface). According to patent reference 1, an interference map e(x,y) is the sum of a plurality of eigenfunctions and is given by:

$$e(x, y) = \sum_{i=1}^{N'} \sqrt{\lambda_i}\, FT[\Phi_i(f, g)] \qquad (1)$$

where FT is the Fourier transform, and N' is typically 1.

In patent reference 1, each mask pattern element is substituted by a point or line, and it is convoluted with the interference map, thereby deriving the interference map on the entire mask. Therefore, the interference map e(x,y) exhibits simple coherency.

However, the interference map e(x,y) does not take account of the pattern (e.g., the contour) of the mask. When such an interference map is used to calculate the approximate aerial image, it is necessary to derive an interference map e'(x,y) which takes account of the mask pattern.

For this purpose, singular value decomposition is performed for the TCC. Let $\lambda_i$ be the i-th eigenvalue, $\Phi_i(f,g)$ be the i-th eigenfunction, and a(f,g) be the diffracted light distribution on the mask pattern. Then, the interference map e'(x,y) which takes account of the mask pattern is derived by:

$$e'(x, y) = \sum_{i=1}^{N'} \sqrt{\lambda_i}\, FT[a(f, g)\Phi_i(f, g)] \qquad (2)$$

The use of the interference map e'(x,y) indicated by relation (2) yields the approximate aerial image.

A method of calculating the approximate aerial image without singular value (eigenvalue) decomposition of the TCC will be explained. The mask pattern and wafer pattern in a semiconductor exposure apparatus have a partial coherent imaging relationship. The partial coherent imaging requires effective source information to determine the coherency on the mask surface. The coherency herein means the degree of coherency according to the distance on the mask surface.

The coherency of the effective source is incorporated in the TCC described above. The TCC is generally defined by the pupil plane of the projection optical system, and represents a region in which the effective source, the pupil function of the projection optical system, and the complex conjugate of the pupil function of the projection optical system overlap each other. The TCC is given by a four-dimensional function:

$$TCC(f',g',f'',g'') = \iint S(f,g)P(f+f',g+g')P^*(f+f'',g+g'')dfdg \qquad (3)$$

where (f,g) is the coordinates on the pupil plane, S(f,g) is a function which describes the effective source, and P(f,g) is the pupil function. Note that * represents the complex conjugate, and the integration range is from −∞ to ∞. The aberration of the projection optical system, the polarization of the illumination light, the resist information, and the like can be incorporated in the pupil function P(f,g). In this specification, the term "pupil function" often includes pieces of information on the polarization, aberration, and resist as needed.

A function I(x,y) which describes an aerial image using the TCC is calculated as the quadruple integral of the TCC:

$$I(x, y) = \int\int\int\int TCC(f', g', f'', g'')a(f,g)a^*(f',g') \times \qquad (4)$$
$$\exp\{-i2\pi[(f'-f'')x + (g'-g'')y]\}df'dg'df''dg''$$

where a(f,g) is a function obtained by Fourier-transforming a function which describes the mask, that is, a function which describes the spectral distribution (diffracted light distribution) on the mask. Note that * represents the complex conjugate, and the integration range is from −∞ to ∞. Details of relation (4) are described in M. Born and E. Wolf, "Principles of Optics", England, Cambridge University Press, 1999, 7th (extended) edition, pp. 554-632.

Assume that relation (4) is directly computed using a computer. In this case, using a discrete variable, relation (4) can be rewritten as:

$$I(x, y) = \qquad (5)$$
$$\sum_{f',g'} a(f', g')\exp[-i2\pi(f'x+g'y)] \times F^{-1}[W_{f',g'}(f'',g'')a^*(f'',g'')]$$

where $F^{-1}$ represents the inverse Fourier transform. For given fixed coordinates (f',g'), $W_{f',g'}(f'',g'')$ is defined by:

$$W_{f',g'}(f'',g'') = TCC(f',g',f'',g'') \qquad (6)$$

Because (f',g') is fixed herein, $W_{f',g'}(f'',g'')$ is a two-dimensional function, which will be referred to as a two-dimensional transmission cross coefficient (TCC) in this specification. The two-dimensional TCC $W_{f',g'}(f'',g'')$ is recomputed every time the value of (f',g') changes in executing an addition loop in the computer computation. In relation (5), the TCC described by a four-dimensional function in relation (3) is unnecessary, and the double loops need only be computed. Hence, the use of the two-dimensional transmission cross coefficient allows to shorten the computation time and to reduce the computation amount (to prevent an increase in the data volume of the computer memory).

Relation (5) can be rewritten as:

$$I(x, y) = \sum_{f',g'} Y_{f',g'}(x, y) \qquad (7)$$

$Y_{f',g'}(x,y)$ is defined by:

$$Y_{f',g'}(x, y) = \qquad (8)$$
$$a(f', g')\exp[-i2\pi(f'x+g'y)] \times F^{-1}[W_{f',g'}(f'',g'')a^*(f'',g'')]$$

The aerial image computation method using relation (7) will be referred to as an aerial image decomposition method, and $Y_{f',g'}(x,y)$ defined for each of the coordinates (f',g') will be referred to as a function which describes a component of an aerial image (aerial image component) in this specification.

The difference between relations (3) and (6) will be explained in detail. The center of the effective source is assumed to be the origin of the pupil coordinate system. The TCC is defined as the sum in a region in which a function obtained by shifting the pupil function P(f,g) of the projection optical system by the coordinates (f',g'), a function obtained by shifting the complex conjugate function P*(f,g) of the function P(f,g) by the coordinates (f'',g''), and the function which describes the effective source overlap each other. P*(f, g) will often be referred to as the complex conjugate function of the pupil function of the projection optical system.

$W_{f',g'}(f'',g'')$ in relation (6) is defined when P(f,g) shifts by a given amount (f',g'). $W_{f',g'}(f'',g'')$ is defined as the sum in a region in which the effective source and the pupil function overlap each other, and that in which the effective source and a function obtained by shifting P*(f,g) by (f'',g'') overlap each other.

$Y_{f',g'}(x,y)$ is also defined when P(f,g) shifts by a given amount (f',g'). $W_{f',g'}(f'',g'')$ and the function a*(f'',g'') as the complex conjugate of a function which describes the spectrum amplitude (diffracted light amplitude) on the mask are multiplied, and the product is inversely Fourier-transformed. The function obtained by the inverse Fourier transformation is then multiplied by the function exp [−i2π(f'x+g'y)] which describes the oblique incidence effect corresponding to a shift in pupil function, and the diffracted light amplitude a(f',g') at the coordinates (f',g') to yield $Y_{f',g'}(x,y)$. The function as the complex conjugate of the function which describes the diffracted light amplitude on the mask will be referred to as the complex conjugate function of the diffracted light distribution on the mask hereinafter.

The function exp [−i2π(f'x+g'y)] which describes the oblique incidence effect will be explained. Let θ be the angle between the optical axis and the direction, in which a plane wave travels, described by exp [−i2π(f'x+g'y)]. Then, since $\sin^2 \theta = (NA/\lambda)(f'^2+g'^2)$, the direction in which the plane wave travels is inclined with respect to the optical axis. Therefore, this function describes the oblique incidence effect. exp [−i2π(f'x+g'y)] can also be interpreted to be a function which describes a plane wave traveling in the direction of a line which connects the coordinates (f',g') on the pupil plane and a point at which the optical axis intersects the image plane. Because the diffracted light amplitude a(f',g') at the coordinates (f',g') on the pupil plane is a constant, the multiplication by the diffracted light amplitude at the coordinates (f',g') amounts to multiplication by a constant.

The approximation of an aerial image will be explained. A function $I_{app}(x,y)$ which describes the approximate aerial image is defined by:

$$I_{app}(x, y) \approx \sum_{m=1}^{M'} Y_{f',g'}(x, y) \qquad (9)$$

Note that there are a total of M combinations of the coordinates (f',g'), and M' is an integer equal to or less than M. If M'=M, the approximate aerial image corresponds to relation (7), and a perfect aerial image can be obtained. If M'=1, the approximate aerial image is $Y_{0,0}(x,y)$ as given by:

$$I_{app}(x, y) \approx \sum_{m=1}^{1} Y_{f',g'}(x, y) \qquad (10)$$
$$= a(0,0)F^{-1}[W_{0,0}(f'',g'')a^*(f'',g'')]$$
$$= Y_{0,0}(x, y)$$

where a(0,0) is a constant, and $W_{0,0}(f'',g'')$ is the convolution integral between the function which describes the effective source and the complex conjugate function of the pupil plane. The Fourier transformation and inverse Fourier transformation are often exchangeably used. Therefore, $Y_{0,0}(x,y)$ is obtained by multiplying the convolution integral between the function which describes the effective source and the pupil function or its complex conjugate function by the diffracted light distribution or its complex conjugate function, and Fourier-transforming or inversely Fourier-transforming the product.

In this manner, using relation (9) or (10), the approximate aerial image is defined by a function obtained by adding one or two or more aerial image components $Y_{f,g}(x,y)$ assuming that the integer M' is equal to or less than M. The following embodiments use one aerial image component $Y_{f,g}(x,y)$ (relation 10) assuming that M'=1 in relation (9), thereby calculating the approximate aerial image. However, the approximate aerial image can also be calculated by using relation (2).

The physical meaning of the approximate aerial image will be explained in detail. In coherent imaging, a point image distribution function (a function which describes the intensity distribution of point images) can be determined. A Fresnel lens can be fabricated by setting a positive position on the point image distribution function as an opening portion, and setting a negative position on it as a light-shielding portion (or an opening portion having a phase of 180°). When coherent illumination is performed using the thus fabricated Fresnel lens as a mask, an isolated contact hole can be formed by exposure.

The Fresnel lens can be defined in coherent illumination based on the point image distribution function. However, the point image distribution function cannot be calculated in partial coherent illumination. This is because the amplitude on the image plane cannot be calculated in the partial coherent imaging. For this reason, the amplitude on the image plane is approximated in the eigenvalue decomposition method.

However, the physical meaning of the above-described calculation method using the two-dimensional transmission cross coefficient is different from that of the eigenvalue decomposition method. First, the point image distribution function is given by the Fourier transform of the frequency response characteristic (modulation transfer function). The frequency response characteristic in coherent illumination is given by the convolution integral between the pupil function and the effective source, which is the pupil function itself. The frequency response characteristic in incoherent illumination is well known to be given by the autocorrelation of the pupil function. Assuming that the exposure apparatus performs incoherent illumination with coherency σ=1, the frequency response characteristic in incoherent illumination is given by the effective source of the pupil function.

In view of this, the frequency response characteristic in partial coherent illumination is approximated by the convolution integral between the pupil function and the effective source. That is, the frequency response characteristic is approximated by $W_{0,0}(f'',g'')$. To obtain the point image distribution function in partial coherent illumination, $W_{0,0}(f'',g'')$ need only be Fourier-transformed. By determining the opening portion and light-shielding portion of the mask in accordance with the thus calculated point image distribution function, an isolated contact hole can be formed by exposure by the same effect as that of the Fresnel lens.

To improve the imaging characteristic for an arbitrary mask pattern, it is only necessary to calculate the convolution integral between the point image distribution function and the mask function, and determine the mask pattern based on the obtained result. According to relation (10), $Y_{0,0}(x,y)$ is obtained by Fourier-transforming the product between the diffracted light distribution and $W_{0,0}(f'',g'')$. The diffracted light distribution is the Fourier transform of the mask function, and $W_{0,0}(f'',g'')$ is the Fourier transform of the point image distribution function. Consequently, $Y_{0,0}(x,y)$ is the convolution integral between the mask function and the point image distribution, according to a given formula.

According to the above description, deriving $Y_{0,0}(x,y)$ amounts to calculating the convolution integral between the point image distribution function and the mask function in partial coherent imaging.

As described above, $W_{0,0}(f'',g'')$ approximates the frequency response characteristic in partial coherent illumination. $W_{f,g}(f'',g'')$ other than $W_{0,0}(f'',g'')$ can be the to be frequency response characteristics omitted in approximating the frequency response characteristic in partial coherent illumination. $Y_{f,g}(x,y)$ other than $Y_{0,0}(x,y)$ can be, in turn, the to be components omitted in calculating the convolution integral between the point image distribution function and the mask pattern function in partial coherent illumination. For this reason, the approximation accuracy improves as M' is set to more than 1 in relation (9).

The conventional interference map is obtained by the eigenvalue decomposition of a four-dimensional TCC, so aerial image calculation requires squaring the absolute values of eigenfunctions and adding the resultant values. However, aerial image calculation by the aerial image decomposition method as in relation (7) requires merely adding aerial image components without squaring the absolute values of aerial image components. The aerial image decomposition method and singular value (eigenvalue) decomposition method use physical quantities of different units, and therefore have completely different features.

In step S104, a two-dimensional image is extracted from the approximate aerial image calculated in step S102. More specifically, a two-dimensional image in the section of an approximate aerial image is extracted by setting a reference slice value (Io). For example, if the pattern data is a light-transmitting pattern, a portion at which the intensity value is equal to or higher than a predetermined value (a threshold which can be set arbitrarily) is extracted from the approximate aerial image as the two-dimensional image. If the pattern data is a light-shielding pattern, a portion at which the intensity value is equal to or lower than a predetermined value (a threshold which can be set arbitrarily) is extracted from the approximate aerial image as the two-dimensional image.

In step S106, the control unit 20 compares the two-dimensional image extracted in step S104 with the target pattern to determine whether the difference between the two-dimensional image and the target pattern falls within a preset allowance. A parameter (evaluation value) used to compare the two-dimensional image with the target pattern can be the line width or pattern length, the NILS (Normalized Image Log Slope), or the intensity peak value.

If the control unit 20 determines in step S106 that the difference between the two-dimensional image and the target pattern falls outside the allowance, in step S108 it determines the main pattern such that the difference between the two-dimensional image and the target pattern falls within the allowance. More specifically, in step S108, the control unit 20 deforms the shape of the main pattern based on the two-dimensional image, thereby determining a new main pattern. Detailed processing of determining the main pattern in step S108 will be explained in the first to fourth embodiments to be described later.

In step S110, using the main pattern deformed in step S108 as the pattern data, the control unit 20 calculates the approximate aerial image from the effective source information, NA information, λ information, aberration information, and resist information input by the user, and the process then returns to step S104. The process operations in steps S104 to S110 are repeated until the difference between the two-dimensional image and the target pattern falls within the allowance.

If the control unit 20 determines in step S106 that the difference between the two-dimensional image and the target pattern falls within the allowable value, it determines an assist pattern in step S112. First, a position at which the assist pattern is inserted (assist pattern insertion position) is extracted from the approximate aerial image (i.e., the approximate aerial image of the deformed main pattern) calculated in step S110. The assist pattern insertion position is a peak portion at which the light intensity takes a peak value (local maximal value or local minimal value) in a region which neither exceeds the reference slice value (Io) nor overlaps the main pattern (i.e., a region other than a region onto which the target pattern is projected). Note that an actual assist pattern insertion position is a portion on the mask corresponding to the peak portion. The size of the assist pattern is then determined based on the light intensity of the peak portion, and the assist pattern is inserted at the peak position. Detailed processing of determining an assist pattern in step S112 will be explained in the first to fourth embodiments to be described later.

In step S114, the control unit 20 generates, as the mask data, data including the main pattern determined in step S108 and assist patterns identical to that determined (inserted) in step S112.

In this manner, the mask data generation program (mask data generation method) executes the aerial image calculation step, two-dimensional image extraction step, main pattern determination step, peak portion extraction step, assist pattern determination step, and generation step.

Note that assist pattern insertion often changes the optical proximity effect by the main pattern. When this occurs, mask data need only be generated by taking account of the optical proximity effect between the main pattern and the assist patterns, as shown in FIG. 3.

Figure 3:
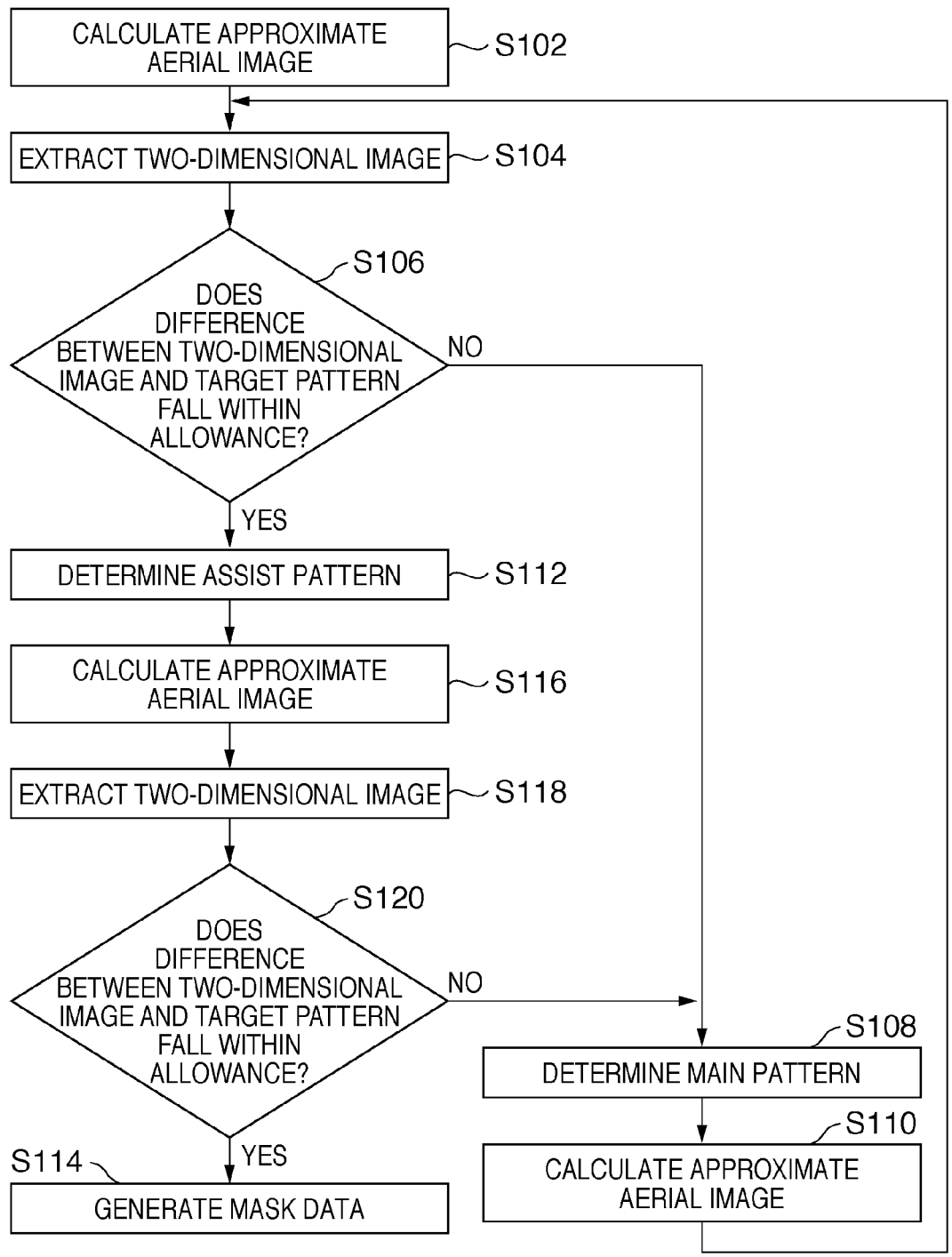
FIG. 3 is a flowchart for explaining another processing of generating mask data by executing a mask data generation program by the control unit of the processing apparatus shown in FIG. 1.

Referring to FIG. 3, in step S116, the control unit 20 calculates the approximate aerial image using, as the pattern data, a pattern obtained by adding the main pattern determined in step S108 and the assist patterns determined in step S112. Pieces of input information other than the pattern data are the effective source information, NA information, λ information, aberration information, and resist information input by the user.

In step S118, the control unit 20 extracts a two-dimensional image from the approximate aerial image calculated in step S116.

In step S120, the control unit 20 compares the two-dimensional image extracted in step S118 with the target pattern to determine whether the difference between the two-dimensional image and the target pattern falls within a preset allowance.

If the control unit 20 determines in step S120 that the difference between the two-dimensional image and the target pattern falls outside the allowance, the process returns to step S108. The control unit 20 then determines the main pattern such that the difference between the two-dimensional image and the target pattern falls within the allowance.

If the control unit 20 determines in step S120 that the difference between the two-dimensional image and the target pattern falls within the allowance, the process advances to step S114. In step S114, the control unit 20 generates, as the mask data, a pattern obtained by adding the main pattern determined in step S108 and assist patterns identical to that determined in step S112.

In the processing shown in FIG. 3, a first aerial image calculation step corresponding to step S102, a first two-dimensional image extraction step corresponding to step S104, and a first main pattern determination step corresponding to step S108 are executed first. A first peak portion extraction step and first assist pattern determination step corresponding to step S112, a second aerial image calculation step corresponding to step S116, and a second two-dimensional image extraction step corresponding to step S118 are executed next. A second main pattern determination step corresponding to step S108, a second peak portion extraction step and second assist pattern determination step corresponding to step S112, and a generation step corresponding to step S114 are executed lastly.

Figure 2:
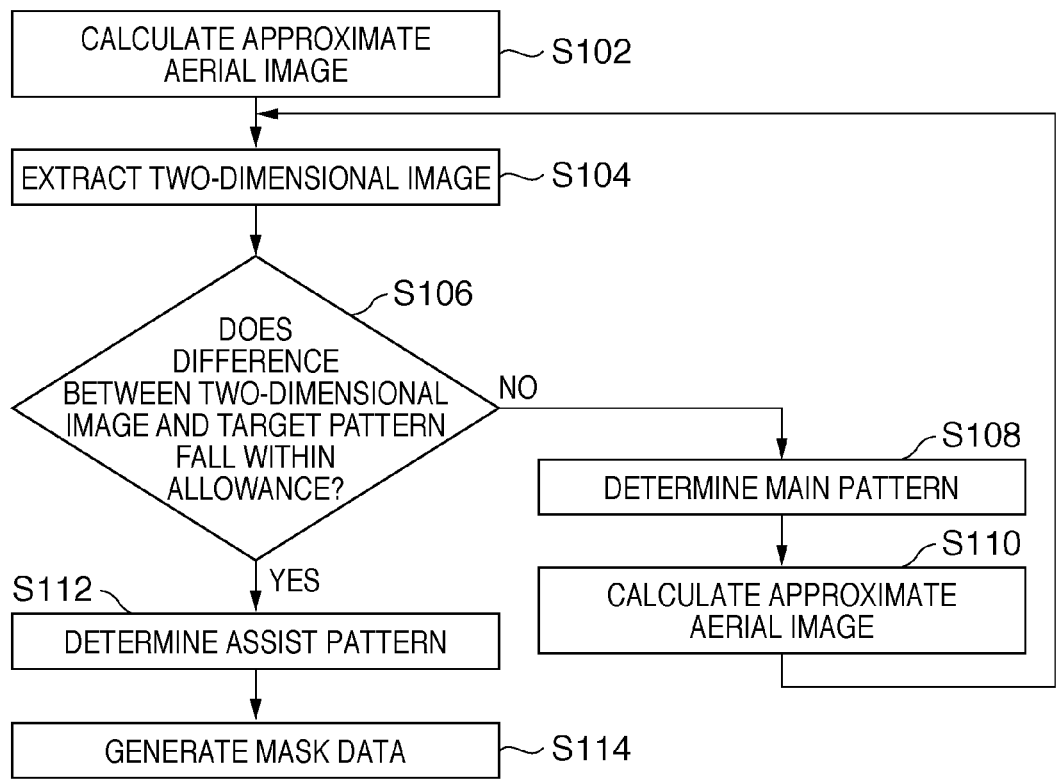
FIG. 2 is a flowchart for explaining processing of generating mask data by executing a mask data generation program by a control unit of the processing apparatus shown in FIG. 1.

By exposure processing using a mask fabricated by generating mask data by the processing shown in FIGS. 2 and 3, and inputting the generated data to an EB drawing apparatus, a micropattern can be formed on the substrate with high precision. In other words, it is possible to generate data of a mask which can form a micropattern with high precision. The generated mask pattern may include patterns other than the patterns generated by the above-described mask data generation program.

In the following first to fourth embodiments, processing of generating mask data by executing the mask data generation program will be explained in detail, and the mask data generated by this processing will be explained. Note that λ is the wavelength of the exposure light, NA is the numerical aperture, on the image plane side, of the projection optical system, and σ is the ratio between the numerical aperture of illumination light which is guided from the illumination optical system to the mask surface and that of the projection optical system on its object plane side.

Since various values can be set to the wavelength λ of the exposure light, and the numerical aperture NA of the projection optical system in the exposure apparatus, the mask pattern size is preferably normalized by (λ/NA). For example, if λ=248 nm and NA=0.73, a pattern having a size of 100 nm is normalized to 0.29 by the above-described method. This normalization will be referred to as k1 conversion hereinafter.

The pattern size on the mask surface is different from that on the wafer surface by the magnification of the projection optical system. For the sake of descriptive simplicity, the ratio between the pattern size on the mask surface and that on the wafer surface is set at 1:1 by multiplying the pattern size on the mask surface by the magnification of the projection optical system in the following embodiments. With this setting, the ratio between the coordinate system on the mask surface and that on the wafer surface also becomes 1:1.

First Embodiment

The first embodiment assumes a case in which an exposure apparatus uses a projection optical system having an NA of 0.73 (corresponding to NA information), and exposure light having a wavelength of 248 nm (corresponding to λ information). In addition, the projection optical system is assumed to have no aberration (corresponding to aberration information), and a resist applied on a wafer is not taken into consideration (corresponding to resist information). Illumination light is not polarized.

Figure 4:
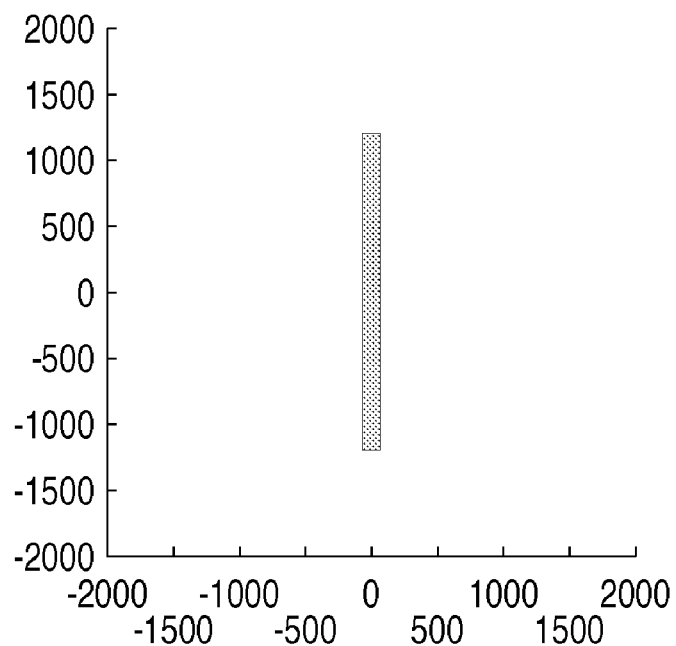
FIG. 4 is a chart showing a target pattern (pattern data) according to the first embodiment.

The target pattern (pattern data) is an isolated line pattern as shown in FIG. 4, which has a line width of 120 nm and a length of 2400 nm. In FIG. 4, the isolated line pattern is a light-shielding pattern (i.e., the transmittance is zero), and the transmittance of a region (background) in which the isolated line pattern does not exist is 1. The phase is zero over the entire region. FIG. 4 is a chart showing a target pattern (pattern data) according to the first embodiment.

Figure 5:
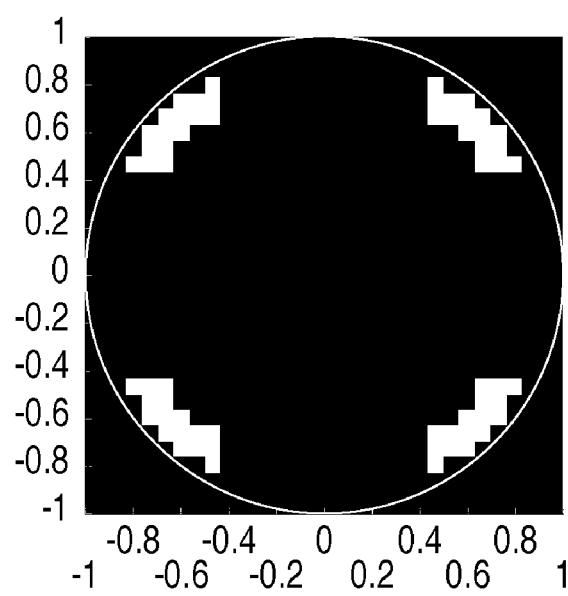
FIG. 5 is a chart showing an effective source according to the first embodiment.

The effective source uses quadrupole illumination (corresponding to effective source information) as shown in FIG. 5. In FIG. 5, the white circular line indicates σ=1, and the four white regions indicate light irradiation portions. Note that FIG. 5 is a chart showing an effective source according to the first embodiment. FIG. 5 merely exemplifies the effective source, and the present invention is not particularly limited to this.

Figure 6A:
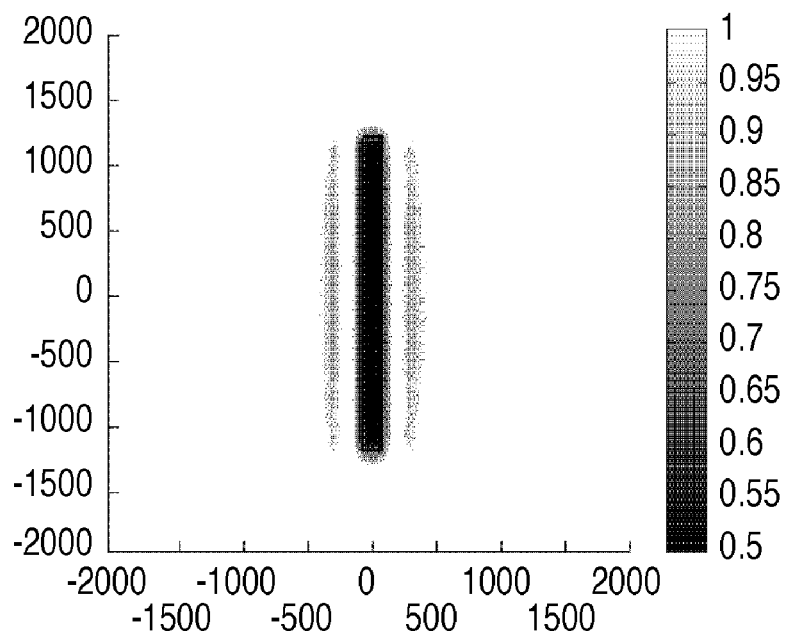
FIGS. 6A and 6B are charts showing approximate aerial images calculated in the first embodiment.

An approximate aerial image shown in FIG. 6A is calculated from the target pattern and the above-described pieces of input information (effective source information, NA information, λ information, aberration information, and resist information) using relation (10). In FIG. 6A, the target pattern is indicated by a solid line superimposed on the approximate aerial image.

In the approximate aerial image shown in FIG. 6A, the isolated line pattern has rounded edges, and the dimension of the light-shielding portion of the target pattern is short as compared with the target pattern.

Figure 6B:
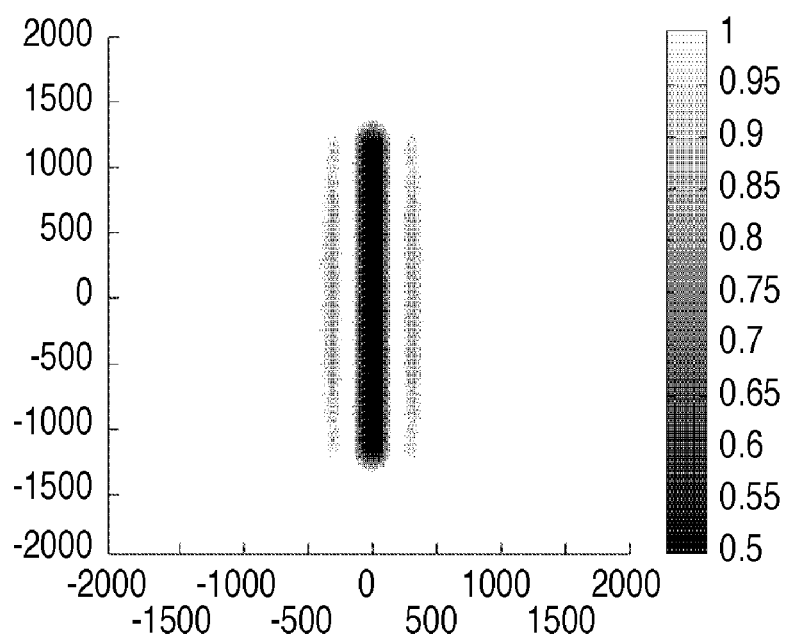

An approximate aerial image shown in FIG. 6B is calculated upon deforming the main pattern by executing the mask data generation program 401 described above. In the approximate aerial image shown in FIG. 6B, the intensity distribution inside the target pattern indicated by a solid line superimposed on it is nearly uniform.

FIG. 7A shows a two-dimensional image (sectional image) obtained by cutting the approximate aerial image shown in FIG. 6A along a reference slice value (Io) of 0.95 Io and 1.05 Io. Likewise, FIG. 7B shows a two-dimensional image (sectional image) obtained by cutting the approximate aerial image shown in FIG. 6B along the reference slice value of 0.95 Io and 1.05 Io. In FIGS. 7A and 7B, the target patterns are indicated by solid lines superimposed on the two-dimensional images. The reference slice value (Io) will also be referred to as a threshold hereinafter.

The difference from the target pattern (for example, a change in shape, the degree of inclination, the intensity value or intensity peak, and Log-slope) can be calculated from the two-dimensional images of the approximate aerial images shown in FIGS. 7A and 7B. Based on the difference, the main pattern is determined (deformed).

The determination (deformation) of the main pattern will be explained in detail. First, as shown in FIG. 8A, the target pattern and pattern data (the initial pattern data is identical to the target pattern) are divided, and the two-dimensional image is divided by the same division number. The divided elements of the target pattern and two-dimensional image are compared with each other, and the pattern data is deformed (corrected) based on their difference. Note that the target pattern is not deformed. The pattern data may be divided by eliminating unnecessary elements or adding new elements.

When the divided elements of the pattern data are deformed based on the difference between the target pattern and the two-dimensional image, pattern data shown in FIG. 8B is obtained. The approximate aerial image is then calculated using the deformed pattern data as new pattern data. The same processing is repeated until the difference between the target pattern and the two-dimensional image falls within the allowance. As described above, the approximate aerial image shown in FIG. 6B is calculated from the pattern data shown in FIG. 8B.

Figure 38:
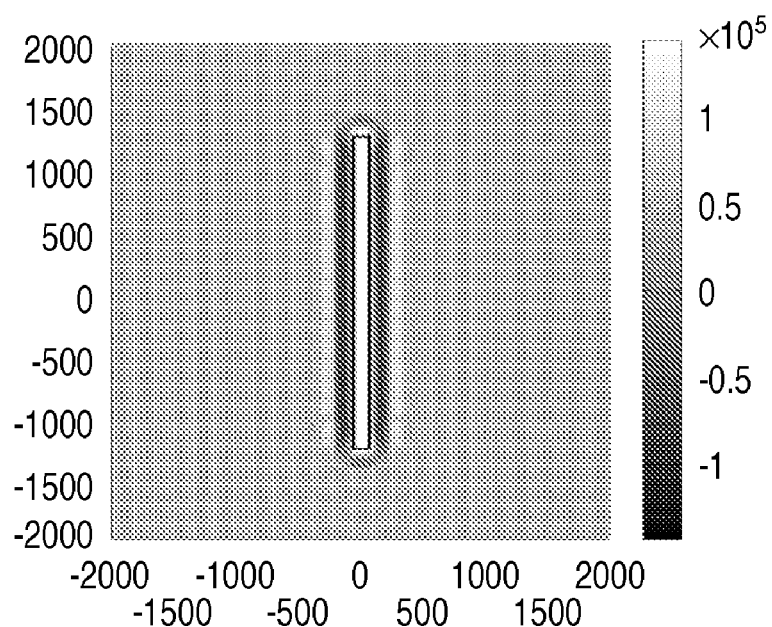
FIG. 38 is a chart showing the second derivative of the approximate aerial image shown in FIG. 6B.

Assist patterns are inserted next. A peak portion at which the light intensity takes a peak value in a region which does not overlap the target pattern (i.e., a region other than a region onto which the main pattern is projected) is extracted from the approximate aerial image shown in FIG. 6B. If the target pattern is a light-shielding pattern, the peak portion in a region in which the light intensity is equal to or higher than the threshold and is darker than the background is calculated, and a square assist pattern is inserted in this peak portion. When a line pattern is used, the peak portion need only be extracted by detecting it one-dimensionally. In this case, the peak portion need only be detected along at least a direction perpendicular to the longitudinal direction of the line pattern, and that parallel to the longitudinal direction of the line pattern. The position at which the assist pattern is inserted may be the barycentric position of the peak portion in a region darker than the background. However, when a line pattern having a certain size is used, the intensity of the main pattern has an influence on a position far from the main pattern in the approximate aerial image. The peak portion then overlaps an intensity peak attributed to interference even in a region which does not overlap the main pattern, so peak portion detection becomes difficult. Under the circumstance, it is also possible to use a method of calculating the peak position (portion) by calculating the values (positive value and negative value) of the second derivatives of the light intensity distribution of the approximate aerial image (e.g., the sum of the second derivatives along two orthogonal axial directions (Laplacians)). FIG. 38 shows a map of the second derivatives (Laplacians) of the intensity distribution. The first derivatives of the intensity distribution along respective directions (gradients) are vulnerable to noise and can be hardly handled. Therefore, a method of calculating the second derivatives of the intensity distribution to calculate the peak position is effective for a line pattern having a complicated shape and certain size.

The dimension of one side of the assist pattern must be a line width small enough not to be resolved. More specifically, when a light-shielding pattern is used, the dimension of one side is calculated in accordance with the ratio between the difference between the light intensity of the background and the minimum value of the light intensity of the main pattern, and that between the light intensity of the background and the minimum value of the light intensity of a region which does not overlap the target pattern. When a line pattern is used, the dimension of one side of the assist pattern is about ⅓ to ½ the dimension of the line pattern in the widthwise direction, depending on the exposure process and the size of the main pattern. When a light-transmitting pattern is used, the dimension of one side is often larger than that values. In the first embodiment, the dimension of one side of the assist pattern in the widthwise direction is 40 nm.

When assist patterns as described above are inserted into the deformed main pattern, pattern data as shown in FIG. 9 is obtained. The pattern data shown in FIG. 9 is thus generated as the mask data. It is confirmed (evaluated) whether a mask fabricated from the mask data forms a desired aerial image on the wafer surface.

The mask data is evaluated not by calculating the approximate aerial image but by precisely calculating the aerial image. FIG. 10 shows a two-dimensional image of an aerial image precisely calculated from the pattern data (mask data) shown in FIG. 9. Referring to FIG. 10, the two-dimensional image is uniform and its length is not shortened, i.e., is closer to the target pattern.

For comparison, the aerial images are calculated for the target pattern itself and a pattern obtained by inserting typical assist patterns (scattering bars) into the target pattern itself. The aerial images are calculated for the target pattern as shown in FIG. 11A itself, and a pattern obtained by inserting assist patterns (scattering bars) having a width of 40 nm into the target pattern at a half pitch (120 nm) as shown in FIG. 12A. FIG. 11B shows a two-dimensional image of the aerial image calculated from the target pattern as shown in FIG. 11A itself. FIG. 12B shows a two-dimensional image of the aerial image calculated from the pattern obtained by inserting scattering bars into the target pattern as shown in FIG. 12A.

The two-dimensional images of the aerial images calculated from the pattern data shown in FIGS. 8B, 9, 11A, and 12A are quantitatively evaluated. More specifically, the aerial images are calculated by changing the defocus from the pattern data, thereby calculating the line widths. In this embodiment, assuming the abscissa as the x-axis, and the ordinate as the y-axis in each drawing, the line widths are calculated at the center of the two-dimensional image (x=0, y=0), a position 70% of y=1200 from the center (x=0, y=840), and a position 90% of y=1200 from the center (x=0, y=1080).

Figure 13:
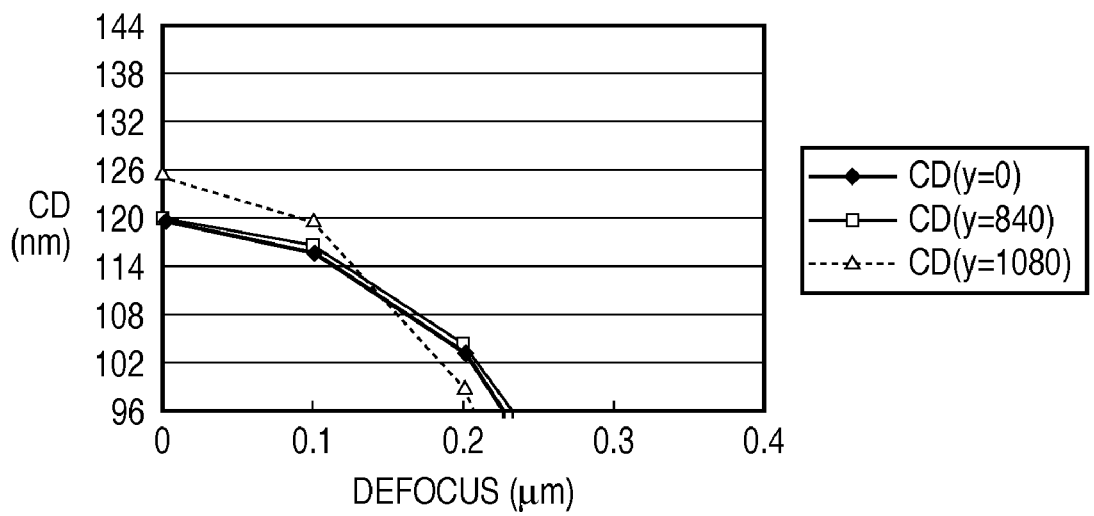
FIG. 13 is a graph showing the line widths calculated from a two-dimensional image of an aerial image based on the pattern data shown in FIG. 8B.
Figure 14:
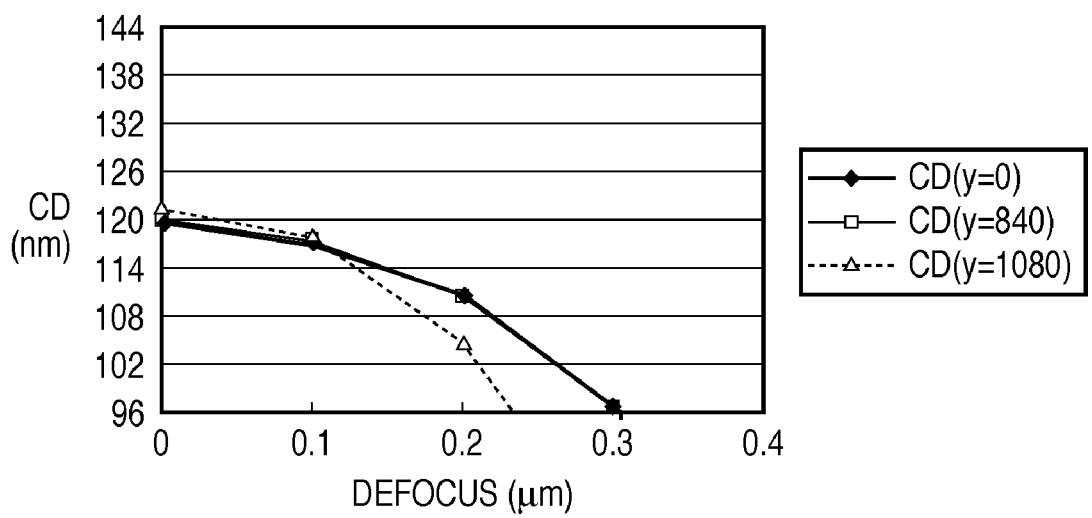
FIG. 14 is a graph showing the line widths calculated from a two-dimensional image of an aerial image based on the pattern data shown in FIG. 9.
Figure 15:
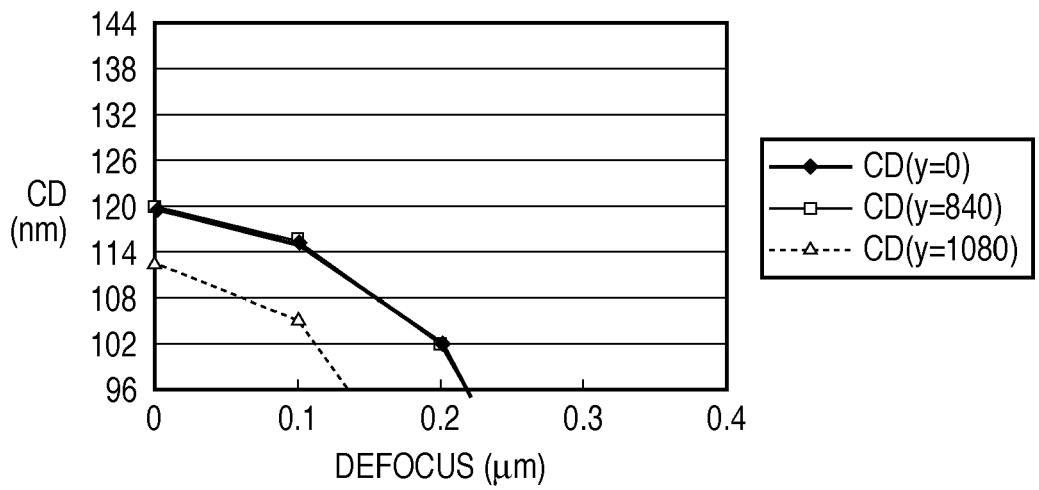
FIG. 15 is a graph showing the line widths calculated from a two-dimensional image of an aerial image based on the pattern data shown in FIG. 11A.
Figure 16:
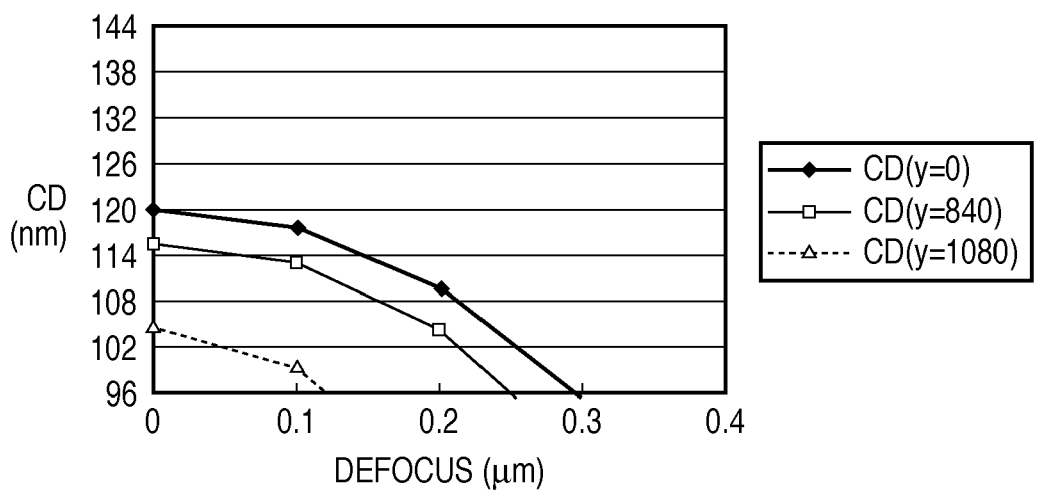
FIG. 16 is a graph showing the line widths calculated from a two-dimensional image of an aerial image based on the pattern data shown in FIG. 12A.

FIG. 13 shows the line widths calculated from a two-dimensional image of an aerial image based on the pattern data shown in FIG. 8B. FIG. 14 shows the line widths calculated from a two-dimensional image of an aerial image based on the pattern data shown in FIG. 9. FIG. 15 shows the line widths calculated from a two-dimensional image of an aerial image based on the pattern data shown in FIG. 11A. FIG. 16 shows the line widths calculated from a two-dimensional image of an aerial image based on the pattern data shown in FIG. 12A. In FIGS. 13 to 16, the abscissa indicates the defocus (μm), and the ordinate indicates the line width CD (nm). Note that the unit of dimension is nm.

Referring to FIG. 15, in the two-dimensional image of the aerial image based on the target pattern as shown in FIG. 11A, the line width at the position 90% from the center is small, and changes in line widths with respect to the focus are large.

Referring to FIG. 16, in the two-dimensional image of the aerial image based on the pattern obtained by inserting scattering bars into the target pattern as shown in FIG. 12A, changes in line widths with respect to the focus are more moderate, but variations in line widths at the positions 70% and 90% from the center are large.

Referring to FIG. 13, in the two-dimensional image of the aerial image based on the deformed main pattern as shown in FIG. 8B, variations in line widths at the positions 70% and 90% are small.

Referring to FIG. 14, in the two-dimensional image of the aerial image based on the pattern obtained by inserting assist patterns into the deformed main pattern as shown in FIG. 9, variations in line widths at the positions 70% and 90% from the center are smallest, and changes in line widths with respect to the focus are more moderate.

In this manner, the image performance of mask data (pattern data) generated by the mask data generation program 401 described above is better than that of mask data obtained by adding scattering bars generated according to the prior art. This makes it possible to form an isolated line pattern with high precision.

Figure 17:
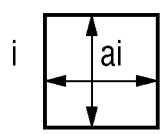
FIG. 17 is a view for explaining a method of changing the size of an assist pattern.

The size of an assist pattern may be changed in accordance with the light intensity of the peak portion (the magnitude of the peak value) instead of keeping it constant. More specifically, letting $a_i$ be the length of one side of the i-th assist pattern, and $a_o$ be a reference dimension, two methods of changing the length $a_i$ of one side of the i-th assist pattern are available, as shown in FIG. 17. Note that FIG. 17 is a view for explaining a method of changing the size of an assist pattern.

The first method changes the length $a_i$ of one side of the i-th assist pattern in proportion to the light intensity of the peak portion as expressed by:

$a_i = a_o \times \sqrt{I_i}$: for a light-transmitting pattern $a_i = a_o \times \sqrt{I_{back} - I_i}$: for a light-shielding pattern (11)

where $I_i$ is the light intensity value at the position of the i-th assist pattern, and $I_{back}$ is the transmittance of the background.

FIG. 18A shows pattern data when the sizes of the assist patterns in the pattern data (mask data) shown in FIG. 9 are changed by the first method.

The second method changes the length $a_i$ of one side of the i-th assist pattern in inverse proportion to the light intensity of the peak portion as expressed by:

$a_i = a_o \times \sqrt{1/I_i}$: for a light-transmitting pattern $a_i = a_o \times \sqrt{1/(I_{back} - I_i)}$: for a light-shielding pattern (12)

In the second method, an upper limit length a_limit is determined in advance to set $a_i$=a_limit for $a_i$>a_limit.

FIG. 18B shows pattern data when the sizes of the assist patterns in the pattern data (mask data) shown in FIG. 9 are changed by the second method.

In the first method, the distribution of the approximate aerial image after assist pattern insertion does not change so significantly from that before assist pattern insertion. Hence, the pattern shape precisely upon assist pattern insertion does not change so significantly from that without assist pattern insertion, and a change in image performance such as an increase in depth of focus is small.

In the second method, the distribution of the approximate aerial image after assist pattern insertion changes significantly from that before assist pattern insertion. Hence, since the second method serves to change the distribution of the approximate aerial image, it is suited to positive use in, e.g., arbitrarily operating the approximate aerial image.

For example, the second method inserts a relatively large assist pattern at a position at which the coherency is low to be able to increase its influence on the main pattern. In other words, the coherency can be enhanced by inserting a relatively large assist pattern at a position at which the coherency is low. It is also possible to maximize a change in image performance such as an increase in depth of focus.

Even when a relatively large assist pattern is inserted into a position at which the coherency is low, it is never resolved unwantedly as long as an upper limit size below which an assist pattern is not resolved beyond a threshold is determined. In fact, the upper limit size below which an assist pattern is not resolved depends on the intensity of the approximate aerial image at a position at which the assist pattern is inserted. Accordingly, the size of each assist pattern may be calculated based on the intensity at the position at which it is inserted. Note that the pattern shape precisely significantly changes as compared to a case in which no assist patterns are inserted. If the pattern shape or the like is overcorrected, it can be corrected again, as will be described in the third embodiment.

Second Embodiment

The second embodiment assumes a case in which an exposure apparatus uses a projection optical system having an NA of 0.75 (corresponding to NA information), and exposure light having a wavelength of 193 nm (corresponding to λ information). In addition, the projection optical system is assumed to have no aberration (corresponding to aberration information), and a resist applied on a wafer is not taken into consideration (corresponding to resist information). Illumination light is not polarized.

Figure 19:
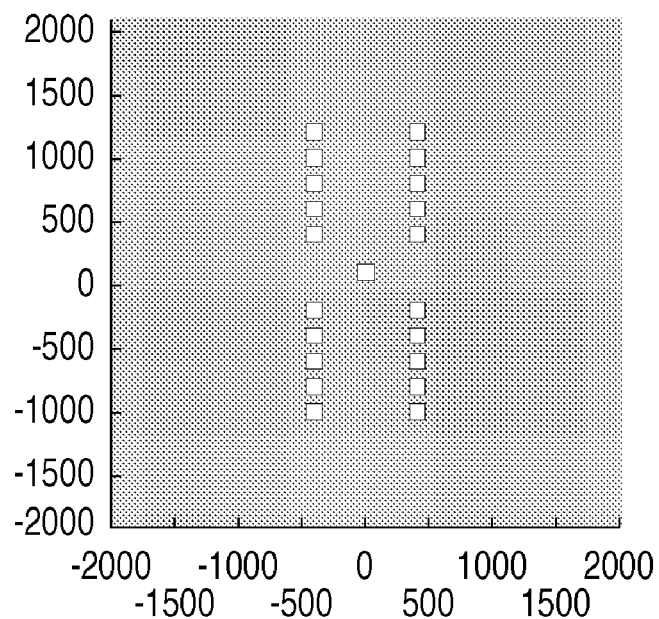
FIG. 19 is a chart showing target patterns (pattern data) according to the second embodiment.

The target patterns (pattern data) are contact hole patterns as shown in FIG. 19, which have a width of 120 nm and are arrayed at a half pitch of 100 nm (k1 conversion value=0.39).

In FIG. 19, each contact hole pattern is a light-transmitting pattern (i.e., the transmittance is 1), and the transmittance of a region (background) in which the contact hole patterns do not exist is zero. The phase is zero over the entire region. FIG. 19 is a chart showing target patterns (pattern data) according to the second embodiment.

Figure 20:
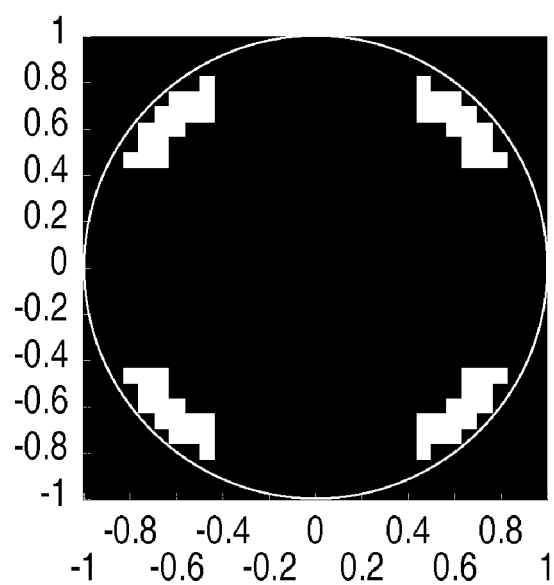
FIG. 20 is a chart showing an effective source according to the second embodiment.

The effective source uses quadrupole illumination (corresponding to effective source information) as shown in FIG. 20. In FIG. 20, the white circular line indicates σ=1, and the four white regions indicate light irradiation portions. Note that FIG. 20 is a chart showing an effective source according to the second embodiment.

Figure 21A:
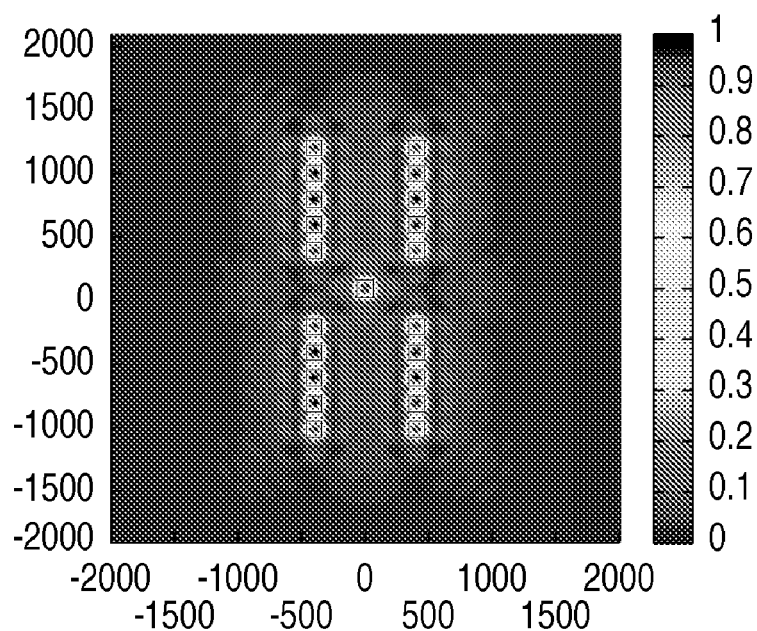
FIGS. 21A and 21B are charts showing approximate aerial images calculated in the second embodiment.

An approximate aerial image shown in FIG. 21A is calculated from the target patterns and the above-described pieces of input information (effective source information, NA information, λ information, aberration information, and resist information) using relation (10). In FIG. 21A, the target patterns are indicated by solid lines superimposed on the approximate aerial image.

In the approximate aerial image shown in FIG. 21A, the light intensity peak value varies for each contact hole pattern.

Figure 21B:
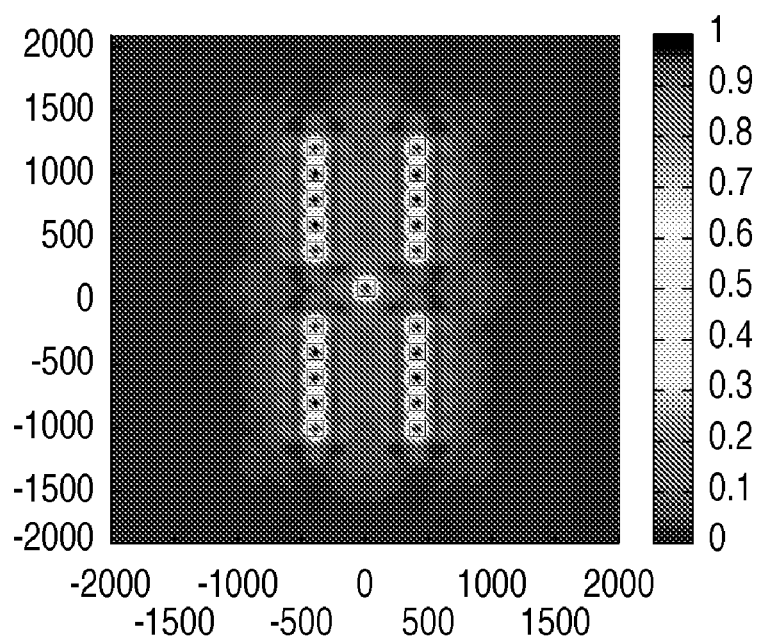

An approximate aerial image shown in FIG. 21B is calculated upon deforming the main pattern by executing the mask data generation program 401 described above. In the approximate aerial image shown in FIG. 21B, the intensity peak value is nearly uniform for each contact hole pattern.

The determination (deformation) of the main pattern will be explained in detail. Although only the sizes and positions of the target patterns are changed without dividing them because the shape of the contact hole pattern is not complicated, it is also possible to divide the target patterns, thereby determining (deforming) the main pattern, as in the first embodiment.

The pattern data is deformed (corrected) based on the difference between the target patterns and a two-dimensional image of the approximate aerial image. Note that the target patterns are not deformed. The approximate aerial image is then calculated using the deformed pattern data as new pattern data. The same processing is repeated until the difference between the target patterns and the two-dimensional image falls within the allowance. From the thus obtained pattern data, an approximate aerial image in FIG. 21B is calculated.

Figure 39:
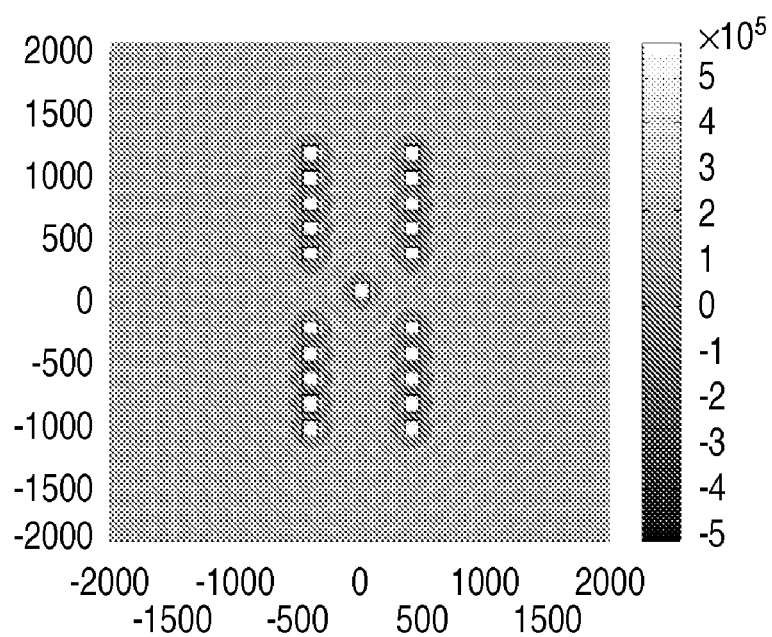
FIG. 39 is a chart showing the second derivative of the approximate aerial image shown in FIG. 21B.

Also, a peak portion at which the light intensity takes a peak value in a region which does not overlap the target patterns (i.e., a region other than a region onto which the main pattern is projected) is extracted from the approximate aerial image shown in FIG. 21B. If each target pattern is a light-transmitting pattern, the peak portion in a region in which the light intensity is equal to or lower than the threshold and is brighter than the background is calculated, and a square assist pattern is inserted in this peak portion. When contact hole patterns are used, the peak portions need only be extracted by detecting them two-dimensionally. The position at which the assist pattern is inserted may be the barycentric position of the peak portion in a region brighter than the background. Even when contact hole patterns are used, the peak positions (portions) can be easily calculated by calculating the values of the second derivatives (for example, Laplacians) of the light intensity distribution of the approximate aerial image. FIG. 39 shows a map of the second derivatives (Laplacians) of the intensity distribution. Also, even when contact hole patterns having a certain size are used, the intensity of the main pattern has an influence on a position far from the main pattern in the approximate aerial image. The peak portion then overlaps an intensity peak attributed to interference even in a region which does not overlap the main pattern, so peak portion detection becomes difficult.

The dimension of one side of the assist pattern must be a line width small enough not to be resolved. More specifically, when a light-transmitting pattern is used, the dimension of one side is calculated in accordance with the ratio between the maximum value of the light intensity of the main pattern and that of the light intensity of a region which does not overlap the target patterns. When contact hole patterns are used, the dimension of one side of the assist pattern is about 60% to 80% the line width of the contact hole pattern, depending on the exposure process and the size of the main pattern. In the second embodiment, the dimension of one side of the assist pattern is 75 nm.

When assist patterns as described above are inserted into the deformed main pattern, pattern data as shown in FIG. 22 is obtained. The pattern data shown in FIG. 22 is thus generated as the mask data. It is confirmed (evaluated) whether a mask fabricated from the mask data forms a desired aerial image on the wafer surface.

FIG. 23 shows a two-dimensional image of an aerial image precisely calculated from the pattern data (mask data) shown in FIG. 22. FIG. 24B shows a two-dimensional image of an aerial image precisely calculated from the target patterns as shown in FIG. 24A itself. A comparison between FIGS. 23 and 24B reveals that the two-dimensional image shown in FIG. 23 exhibits a more excellent uniformity of each contact hole and a smaller elliptical distortion than those in the two-dimensional image shown in FIG. 24B.

The two-dimensional images of the aerial images calculated from the pattern data shown in FIGS. 22 and 14A are quantitatively evaluated. More specifically, the aerial images are calculated by changing the defocus from the pattern data, thereby calculating the line widths (hole diameters). In this embodiment, line widths CD of an isolated contact hole pattern $CH_1$ at the center of the two-dimensional image, a contact hole pattern $CH_2$ at the edge of a hole array in which holes are populated, and a contact hole pattern $CH_3$ at the middle of the hole array (see FIG. 24A).

Figure 25:
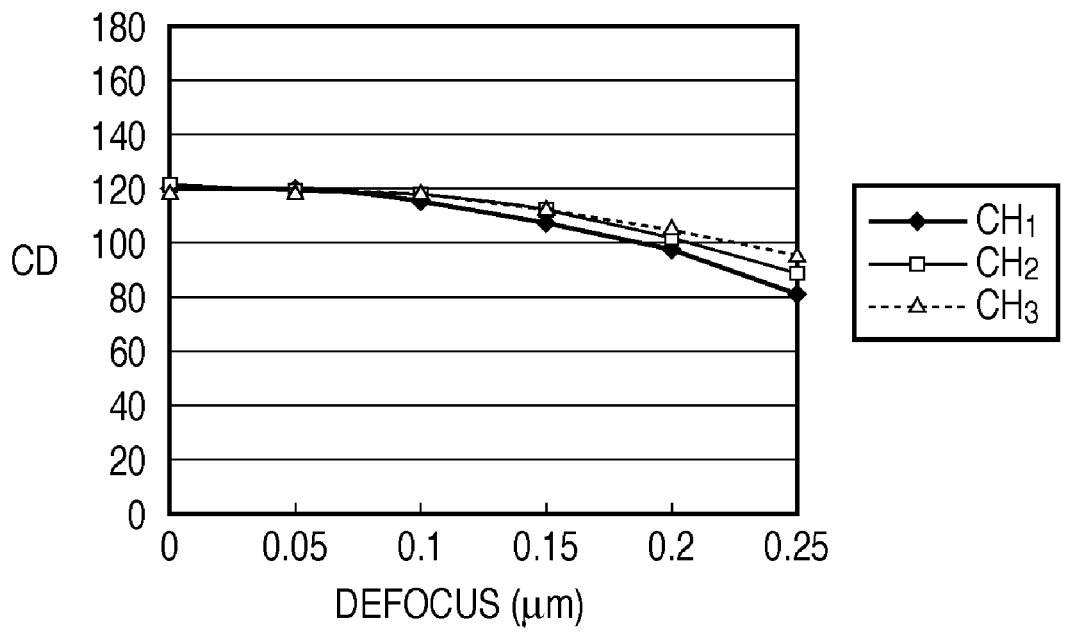
FIG. 25 is a graph showing the line widths calculated from a two-dimensional image of an aerial image based on the pattern data shown in FIG. 22.
Figure 26:
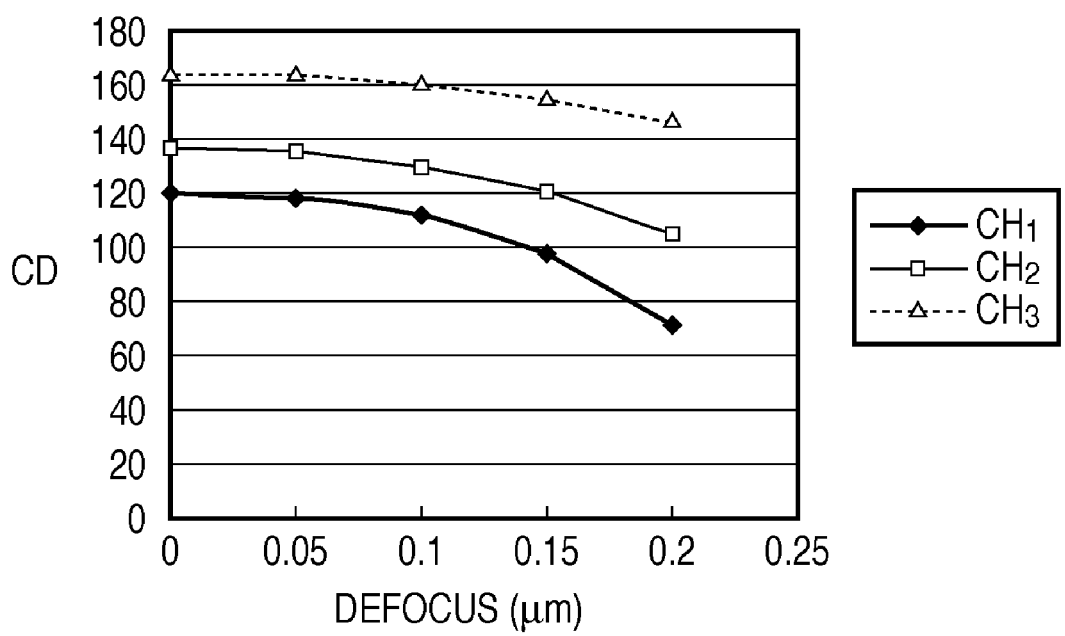
FIG. 26 is a graph showing the line widths calculated from a two-dimensional image of an aerial image based on the pattern data shown in FIG. 24A.

FIG. 25 shows the line widths calculated from a two-dimensional image of an aerial image based on the pattern data shown in FIG. 22. FIG. 26 shows the line widths calculated from a two-dimensional image of an aerial image based on the pattern data shown in FIG. 24A. In FIGS. 25 and 26, the abscissa indicates the defocus (μm), and the ordinate indicates the line width CD (nm).

Referring to FIG. 26, in the two-dimensional image of the aerial image based on the target patterns as shown in FIG. 24A themselves, variations in the line widths of the isolated contact hole pattern and the contact hole patterns of a hole array in which holes are populated are large, and their changes in line widths with respect to the focus are also large.

Referring to FIG. 25, in the two-dimensional image of the aerial image based on the pattern obtained by inserting assist patterns into the deformed main pattern as shown in FIG. 22, variations in line widths are small, and changes in line widths with respect to the focus are small.

In this manner, the image performance of mask data (pattern data) generated by the mask data generation program 401 described above is better than that of mask data generated according to the prior art. This makes it possible to form contact hole patterns with high precision.

Figure 27:
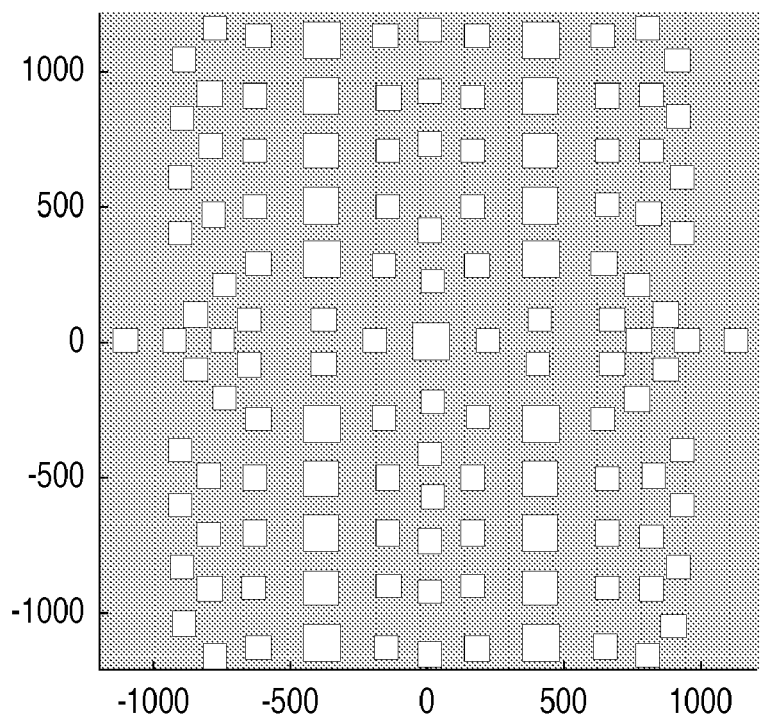
FIG. 27 is a chart showing pattern data obtained by changing the sizes of the assist patterns in the pattern data shown in FIG. 22.

As in the first embodiment, the sizes of the assist patterns may be changed in accordance with the light intensity of the peak portion (the magnitude of the peak value) instead of keeping them constant. FIG. 27 shows pattern data obtained by changing the sizes of the assist patterns in the pattern data (mask data) shown in FIG. 22 by the second method.

Changing the sizes of the assist patterns makes it possible to improve the effect of the assist patterns for the isolated contact hole pattern or the contact hole pattern at the edge of a hole array in which holes are populated.

Figure 28:
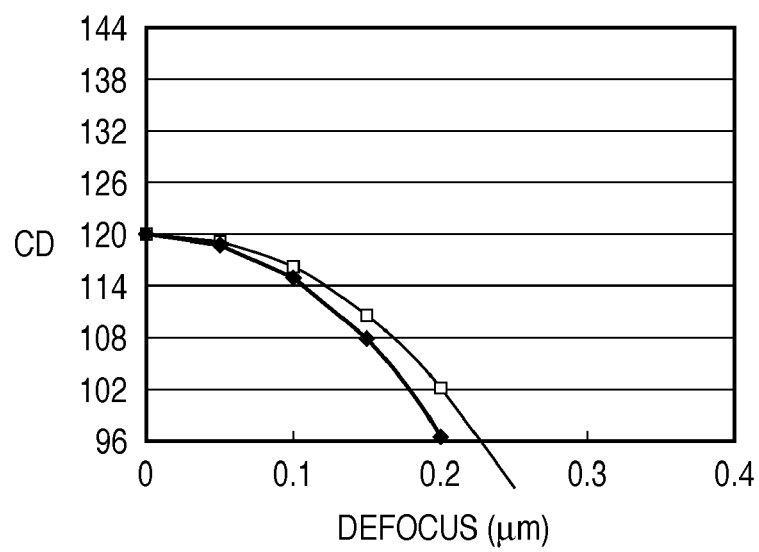
FIG. 28 is a graph showing the line widths calculated from isolated contact hole patterns at the centers of two-dimensional images of aerial images based on the pattern data shown in FIGS. 22 and 27.

FIG. 28 shows the line widths calculated from the isolated contact patterns at the centers of two-dimensional images of aerial images based on the pattern data shown in FIGS. 22 and 27. As described above, the pattern data shown in FIG. 22 is obtained by keeping the sizes of the assist patterns constant, and that shown in FIG. 27 is obtained by changing the sizes of the assist patterns. In FIG. 28, the abscissa indicates the defocus (μm), and the ordinate indicates the line width CD (nm).

Referring to FIG. 28, a change in line width with respect to the focus when the sizes of the assist patterns are changed (FIG. 27) is smaller (i.e., the focus characteristic is better) than that when the sizes of the assist patterns are kept constant (FIG. 22).

Third Embodiment

As described above, assist pattern insertion newly produces the optical proximity effect between the assist patterns and the main pattern. Especially when the sizes of the assist patterns are changed in inverse proportion to the light intensity of the peak portion, the coherency changes significantly. This may result in variations in pattern shape precisely and in individual pattern shapes. In this case, it is effective to recalculate the approximate aerial image after inserting the assist patterns into the deformed main pattern, and to further deform (correct) these pattern data, as in the flowchart shown in FIG. 3.

Figure 29A:
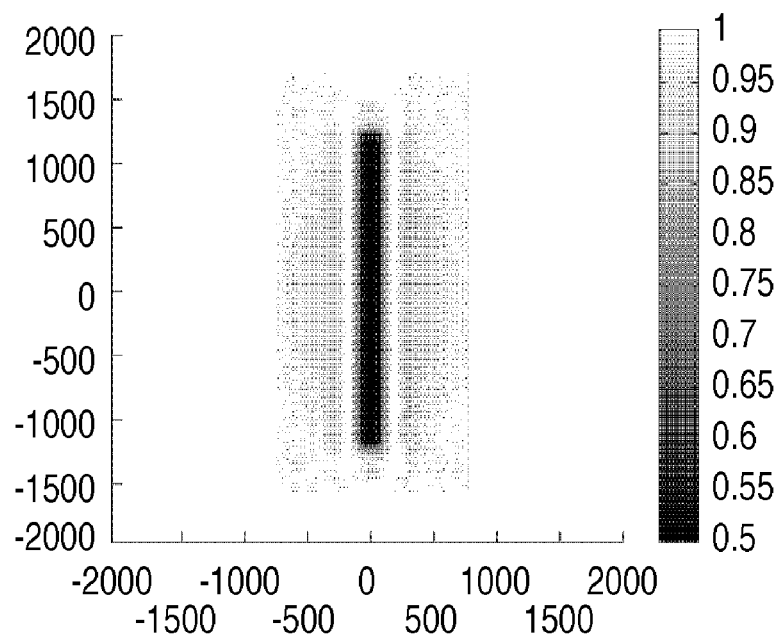
FIG. 29A is a chart showing the approximate aerial image calculated before inserting assist patterns into the main pattern deformed in the first embodiment.
Figure 29B:
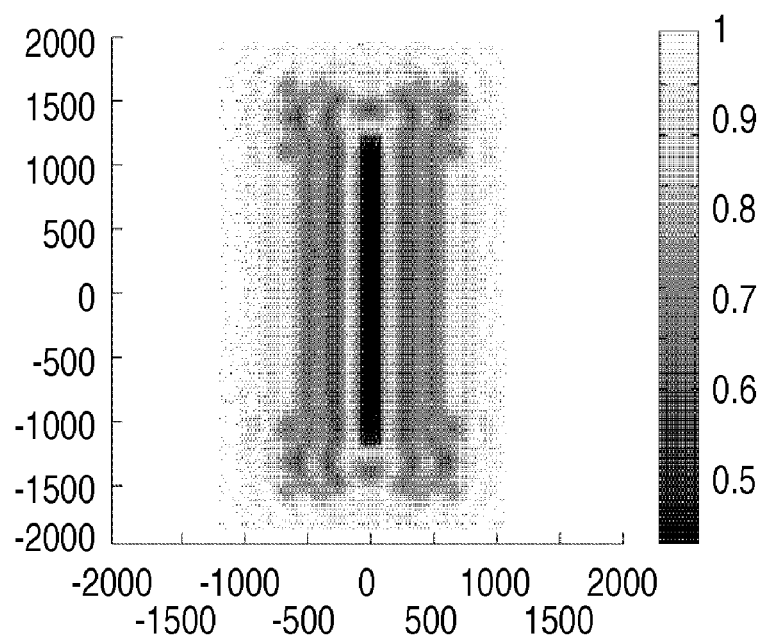
FIG. 29B is a chart showing the approximate aerial image calculated after inserting assist patterns having a constant size into the main pattern deformed in the first embodiment.
Figure 30:
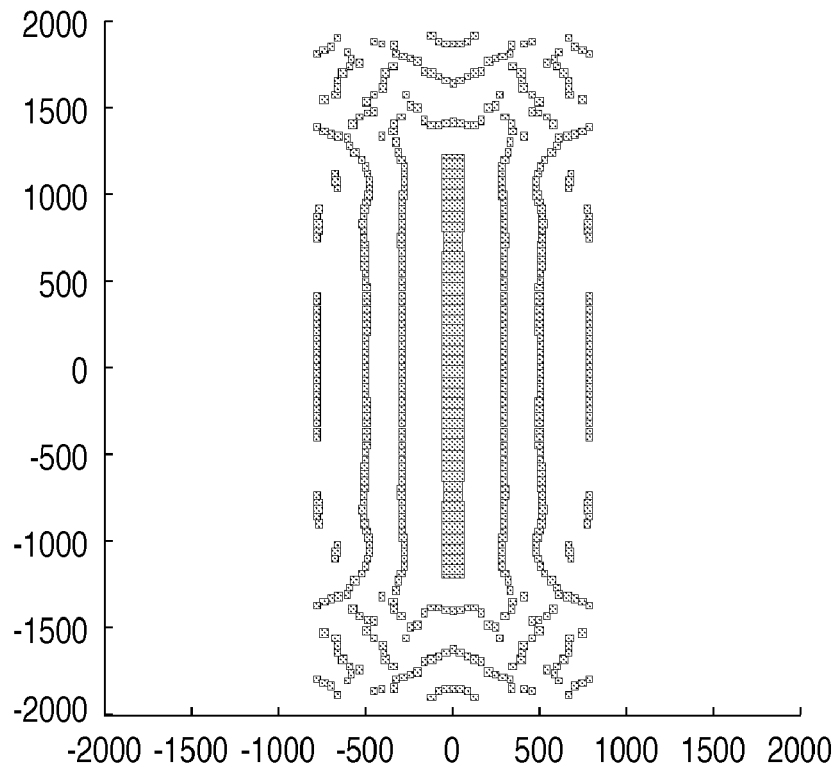
FIG. 30 is a chart showing pattern data obtained by inserting assist patterns into the main pattern in the third embodiment.

The third embodiment will be explained using the example shown in the first embodiment. FIG. 29A shows the approximate aerial image calculated before inserting assist patterns into the main pattern deformed in the first embodiment. FIG. 29B shows the approximate aerial image calculated after inserting assist patterns having a constant size into the main pattern deformed in the first embodiment. A comparison between the approximate aerial images shown in FIGS. 29A and 29B reveals a significant change in distribution. A two-dimensional image is extracted from the approximate aerial image shown in FIG. 29B, and the main pattern is deformed based on the two-dimensional image, as in the first embodiment. Assist patterns are then inserted into the main pattern. The same assist patterns may or may not be used without extracting new assist patterns. In this case, the optical proximity effect which changes upon assist pattern insertion can be corrected as a change in the shape of the main pattern. The approximate aerial image is then calculated using the deformed pattern data as new pattern data. The same processing is repeated until the difference between the target pattern and the two-dimensional image falls within the allowance. FIG. 30 shows the thus obtained pattern data (mask data).

The two-dimensional image of the aerial image calculated from the pattern data shown in FIG. 30 is quantitatively evaluated. More specifically, the aerial image is calculated by changing the defocus from the pattern data, thereby calculating the line widths. In this embodiment, assuming the abscissa as the x-axis, and the ordinate as the y-axis in each drawing, the line widths are calculated at the center of the two-dimensional image (x=0, y=0), a position 70% of y=1200 from the center (x=0, y=840), and a position 90% of y=1200 from the center (x=0, y=1080).

Figure 31:
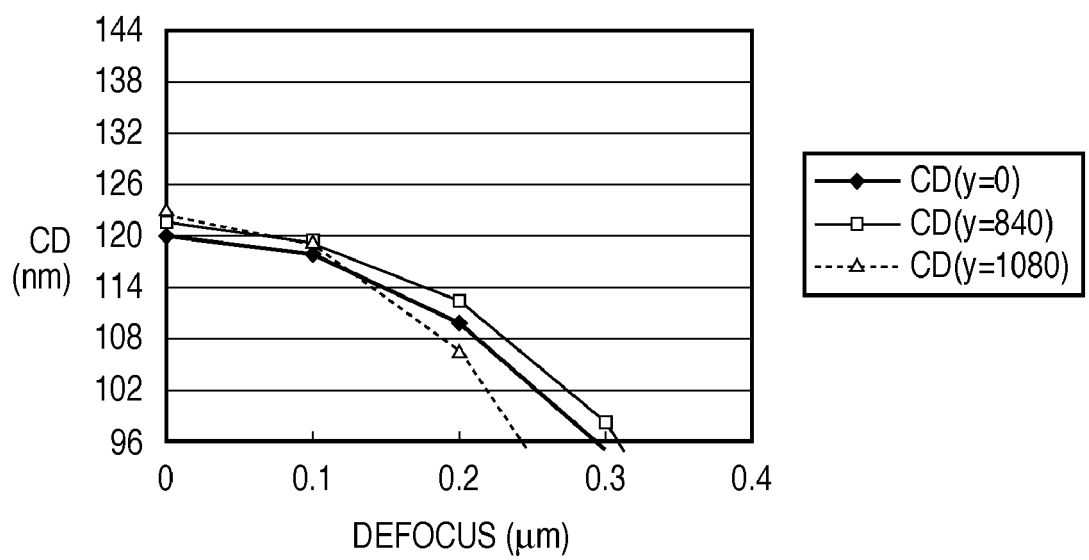
FIG. 31 is a graph showing the line widths calculated from a two-dimensional image of an aerial image based on the pattern data shown in FIG. 30.

FIG. 31 shows the line widths calculated from a two-dimensional image of an aerial image based on the pattern data shown in FIG. 30. A comparison between FIGS. 15 and 31 reveals that in the two-dimensional image of the aerial image based on the pattern data shown in FIG. 30, variations in line widths are smaller, and changes in line widths with respect to the focus are more moderate than those shown in FIG. 11A. The line width calculation result shown in FIG. 31 is nearly the same as that shown in FIG. 14.

When a line pattern is used, a serious problem is that its length shortens. To solve this problem, the edge of the line pattern is evaluated. In a best focus state, the length of the line pattern need only be elongated by expecting the amount of shortening of the line pattern. However, the line pattern shortens along with defocusing, so its length preferably does not change due to focusing. Also, the contrast at the edge of the line pattern is preferably good. The contrast at the edge of the line pattern is evaluated based on the NILS.

Figure 32:
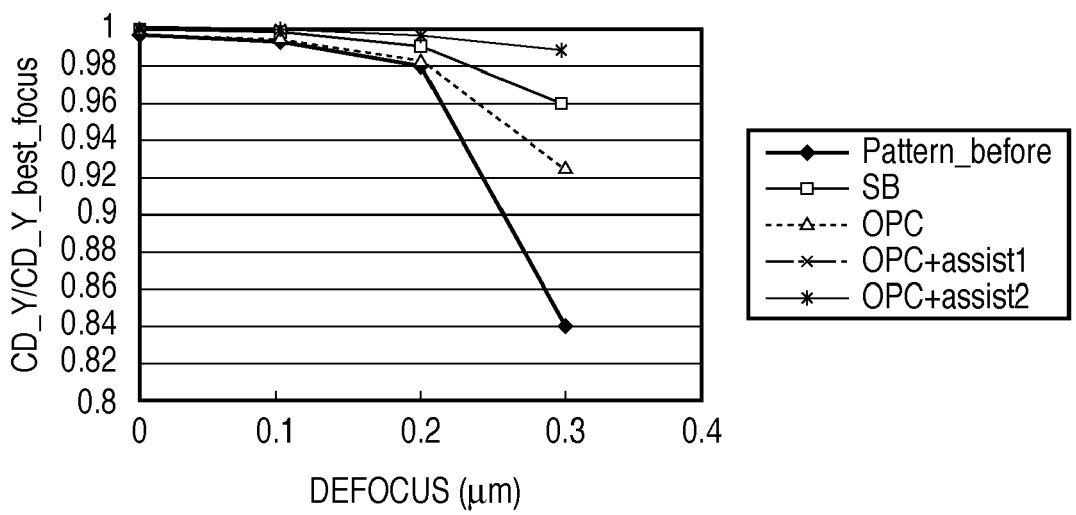
FIG. 32 is a graph showing the result of dividing the length of a line pattern before focusing by that in a best focus state, and checking its change due to focusing.
Figure 33:
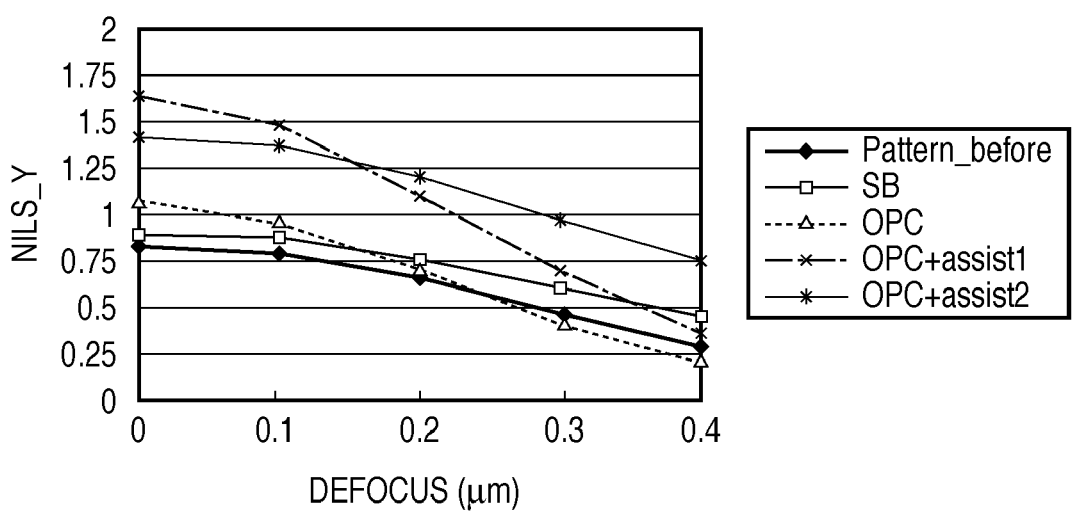
FIG. 33 is a graph showing the result of calculating the NILS of the edge of the line pattern, and checking its change due to focusing.

FIG. 32 shows the result of dividing the length of a line pattern before focusing by that in a best focus state, and checking its change due to focusing. FIG. 33 shows the result of calculating the NILS at the edge of a line pattern, and checking its change due to focusing. In FIGS. 32 and 33, Pattern_before indicates a case in which the pattern data is the target pattern itself (i.e., the initial pattern data) (FIG. 11A). SB indicates a case in which the pattern data is a pattern obtained by inserting scattering bars into the target pattern (FIG. 12A). OPC indicates a case in which the pattern data is a pattern obtained by deforming the main pattern based on the approximate aerial image (FIG. 8B). OPC1+assist1 indicates a case in which the pattern data is a pattern obtained by deforming the main pattern according to the first embodiment based on the approximate aerial image, and inserting assist patterns having a constant size into the main pattern (FIG. 9). OPC2+assist2 indicates a case in which the pattern data is a pattern obtained by deforming the main pattern according to the third embodiment based on the approximate aerial image, and inserting assist patterns having a constant size into the main pattern (FIG. 30).

Referring to FIG. 32, in each of OPC1+assist1 (FIG. 9) and OPC2+assist2 (FIG. 30), a change in the length of the line pattern due to a variation in focus is smallest.

Referring to FIG. 33, the NILS at the edge of the line pattern is largest in a best focus state in OPC2+assist2 (FIG. 30). Also, the NILS at the edge of the line pattern hardly changes with respect to the focus in OPC1+assist1 (FIG. 9), although this tendency is slightly weaker than in OPC2+assist2.

Fourth Embodiment

An embodiment in which the target pattern is a line pattern having another shape will be explained next. The fourth embodiment assumes a case in which an exposure apparatus uses a projection optical system having an NA of 0.73 (corresponding to NA information), and exposure light having a wavelength of 193 nm (corresponding to λ information). In addition, the projection optical system is given a shift in focal position (defocus) as the aberration of the projection optical system, but a resist applied on a wafer is not taken into consideration (corresponding to resist information). Illumination light is not polarized.

Figure 35:
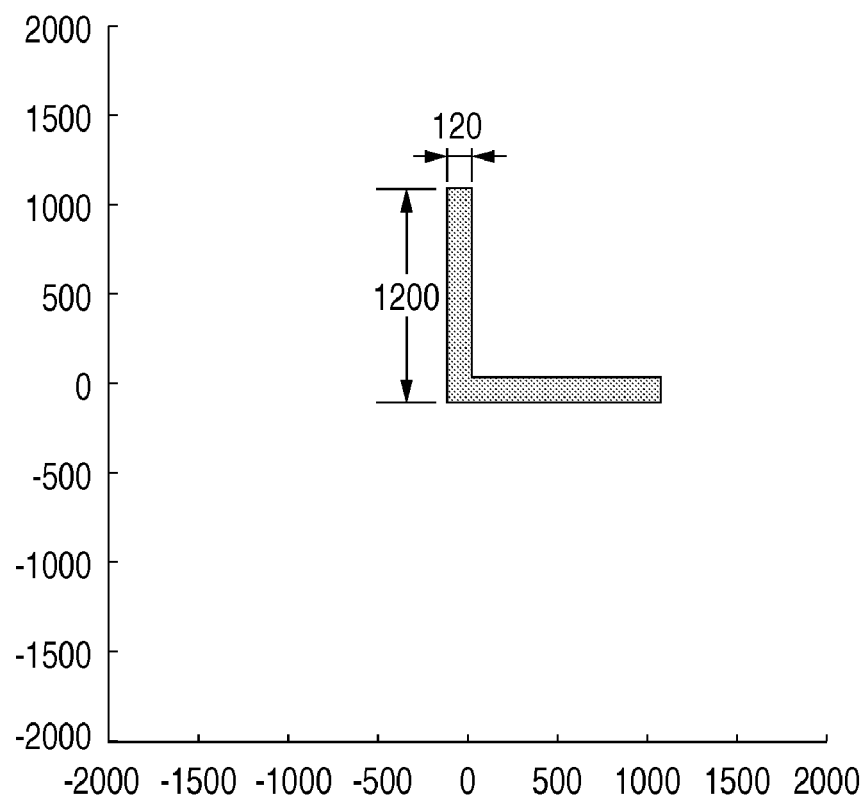
FIG. 35 is a chart showing a target pattern (pattern data) according to the fourth embodiment.

The target pattern (pattern data) is an L-shaped (Elbow) pattern as shown in FIG. 35, which has vertical and horizontal dimensions of 1200 nm. In FIG. 35, an isolated line pattern is a light-shielding pattern (i.e., the transmittance is zero), and the transmittance of a region (background) in which the isolated line pattern does not exist is 1. The phase is zero over the entire region. FIG. 35 is a chart showing a target pattern (pattern data) according to the fourth embodiment. The effective source uses quadrupole illumination (corresponding to effective source information) as shown in FIG. 5.

The approximate aerial image is calculated from the target pattern and the above-described pieces of input information (effective source information, NA information, λ information, aberration information, and resist information) using relation (10). A two-dimensional image is extracted from the calculated approximate aerial image. The pattern data is calculated based on the difference between the target pattern and the two-dimensional image of the approximate aerial image. A peak portion at which the light intensity takes a peak value in a region which does not overlap the target pattern is, in turn, extracted from the approximate aerial image calculated from the pattern data, thereby inserting an assist pattern at this peak portion.

Figure 36:
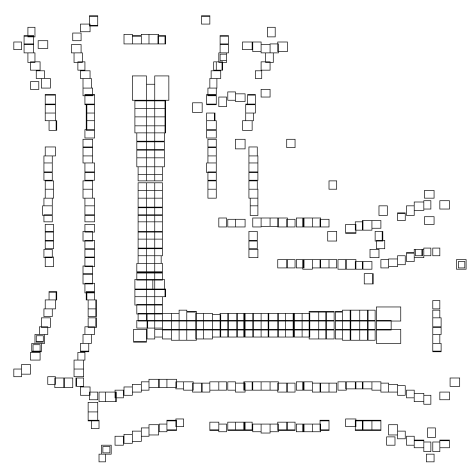
FIG. 36 is a view showing pattern data obtained by inserting assist patterns into the target pattern in the fourth embodiment.

The pattern data shown in FIG. 36 is thus generated as the mask data. FIGS. 37A and 37B show aerial images precisely calculated from the mask data. FIG. 37A shows an aerial image formed in a best focus state. FIG. 37B shows an aerial image formed upon defocusing by 0.2 μm. Referring to FIGS. 37A and 37B, aerial images which are uniform and have small distortions at their corners are obtained, thus suppressing degradation in the performance of an image projected onto the wafer upon defocusing. In other words, the depth of focus increases, resulting in an improvement in imaging performance.

Figure 34:
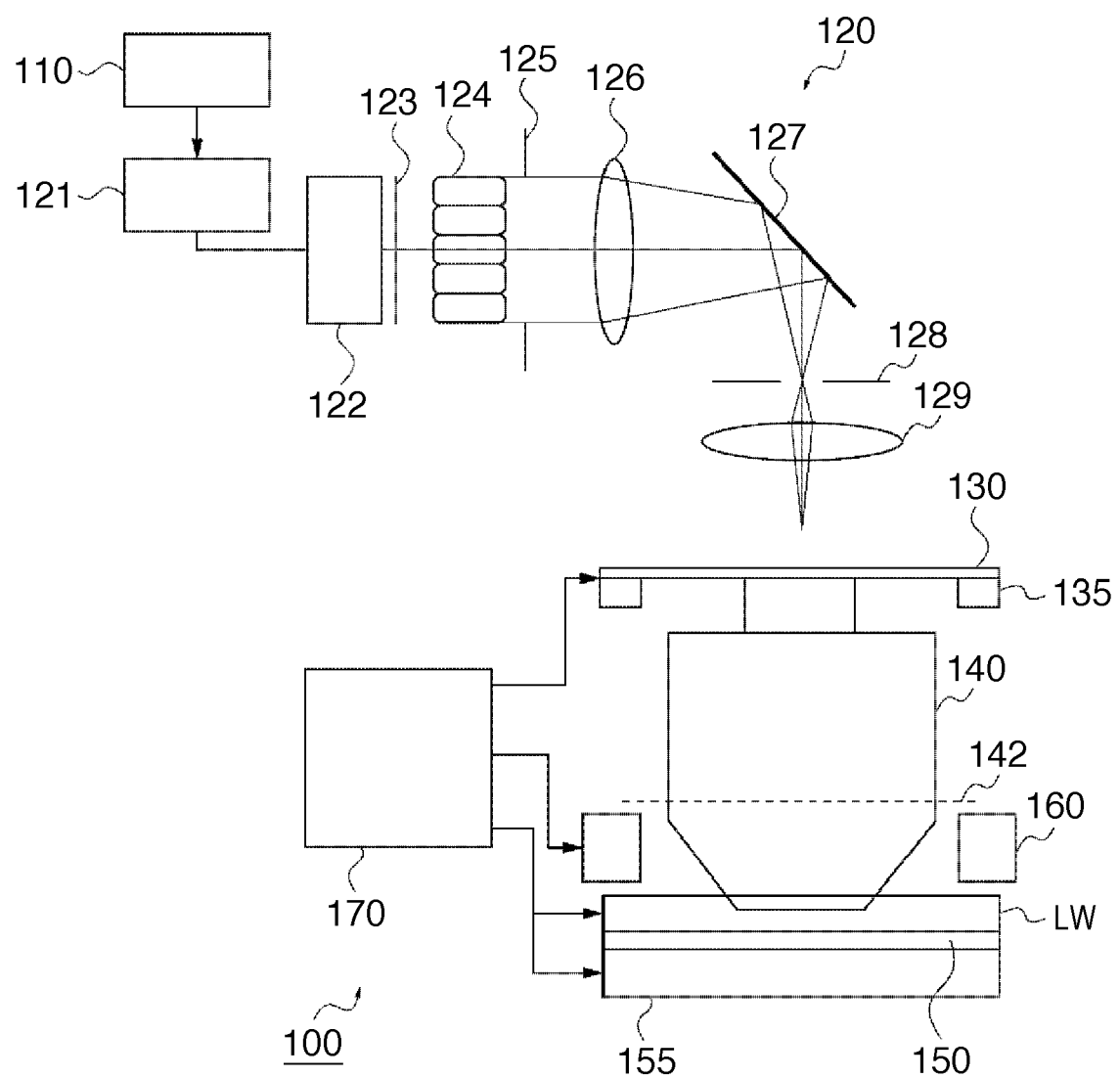
FIG. 34 is a schematic block diagram showing the arrangement of an exposure apparatus according to one aspect of the present invention.

An exposure apparatus 100 will be explained next with reference to FIG. 34. FIG. 34 is a schematic block diagram showing the arrangement of the exposure apparatus 100. A mask 130 fabricated based on mask data generated by executing the above-described mask data generation program is used.

The exposure apparatus 100 is an immersion exposure apparatus which transfers the pattern of the mask 130 onto a wafer 150 by exposure via a liquid LW supplied between the wafer 150 and a projection optical system 140. Although the exposure apparatus 100 adopts the step & scan scheme in this embodiment, it can adopt the step & repeat scheme or another exposure scheme.

As shown in FIG. 34, the exposure apparatus 100 includes a light source 110, an illumination optical system 120, a mask stage 135 for mounting the mask 130, the projection optical system 140, a wafer stage 155 for mounting the wafer 150, a liquid supply/recovery unit 160, and a main control system 170. The light source 110 and illumination optical system 120 constitute an illumination apparatus which illuminates the mask 130 on which a circuit pattern to be transferred is formed.

The light source 110 is an excimer laser such as a KrF excimer laser having a wavelength of about 248 nm, or an ArF excimer laser having a wavelength of about 193 nm. However, the type and number of light sources 110 are not particularly limited. For example, an $F_2$ laser having a wavelength of about 157 nm can also be used as the light source 110.

The illumination optical system 120 illuminates the mask 130 with light from the light source 110. The illumination optical system 120 can implement various illumination modes such as the conventional illumination and modified illumination (for example, quadrupole illumination). In this embodiment, the illumination optical system 120 includes a beam shaping optical system 121, condensing optical system 122, polarization control unit 123, optical integrator 124, and aperture stop 125. The illumination optical system 120 also includes a condenser lens 126, bending mirror 127, masking blade 128, and imaging lens 129.

The beam shaping optical system 121 is, for example, a beam expander including a plurality of cylindrical lenses. The beam shaping optical system 121 converts the horizontal to vertical ratio of the sectional shape of collimated light from the light source 110 into a predetermined value (for example, converts the sectional shape from a rectangle to a square). In this embodiment, the beam shaping optical system 121 shapes the light from the light source 110 into that having a size and an angle of divergence required to illuminate the optical integrator 124.

The condensing optical system 122 includes a plurality of optical elements, and efficiently guides the light shaped by the beam shaping optical system 121 to the optical integrator 124. The condensing optical system 122 includes, for example, a zoom lens system, and adjusts the shape and angle of the light which enters the optical integrator 124.

The polarization control unit 123 includes, for example, a polarizing element, and is set at a position nearly conjugate to a pupil plane 142 of the projection optical system 140. The polarization control unit 123 controls the polarization state of a predetermined region of an effective source formed on the pupil plane 142 of the projection optical system 140.

The optical integrator 124 has a function of uniforming illumination light which illuminates the mask 130, converting the angular distribution of its incident light into a positional distribution, and outputting the obtained light. The optical integrator 124 is, for example, a fly-eye lens having its incident surface and exit surface which hold a Fourier transform relationship. The fly-eye lens is formed by combining a plurality of rod lenses (i.e., microlens elements). However, the optical integrator 124 is not particularly limited to a fly-eye lens, and may be, for example, an optical rod, a diffraction grating, or a cylindrical lens array plate.

The aperture stop 125 is set at a position which is immediately after the exit surface of the optical integrator 124 and is nearly conjugate to an effective source formed on the pupil plane 142 of the projection optical system 140. The aperture shape of the aperture stop 125 corresponds to the light intensity distribution (i.e., the effective source shape) of an effective source formed on the pupil plane 142 of the projection optical system 140. In other words, the aperture stop 125 controls the light intensity distribution of the effective source. The aperture stop 125 can be switched in accordance with the illumination modes. With or without using an aperture stop, the effective source shape may be adjusted by setting a diffractive optical element (CGH) or prism on the side of the light source with respect to the optical integrator 124.

The condenser lens 126 converges the light which has emerged from a secondary light source formed near the exit surface of the optical integrator 124 and passed through the aperture stop 125, and uniformly illuminates the masking blade 128 with it via the bending mirror 127.

The masking blade 128 is set at a position nearly conjugate to the mask 130, and is formed from a plurality of movable light-shielding plates. The masking blade 128 forms a nearly rectangular opening corresponding to the effective area of the projection optical system 140. The light which has passed through the masking blade 128 is used as illumination light which illuminates the mask 130.

The imaging lens 129 forms, on the mask 130, an image of the light which has passed through the opening of the masking blade 128.

The mask 130 is fabricated based on mask data generated by the processing apparatus 1 described above, and has a circuit pattern (main pattern) to be transferred and assist patterns. The mask 130 is supported and driven by the mask stage 135. Diffracted light generated by the mask 130 is projected onto the wafer 150 via the projection optical system 140. The mask 130 and wafer 150 are set to have an optically conjugate relationship. Since the exposure apparatus 100 is of the step & scan scheme, it transfers the circuit pattern to be transferred of the mask 130 onto the wafer 150 by synchronously scanning them. When the exposure apparatus 100 is of the step & repeat scheme, it performs exposure while the mask 130 and wafer 150 stay still.

The mask stage 135 supports the mask 130 via a mask chuck, and is connected to a driving mechanism (not shown). The driving mechanism (not shown) is formed from, for example, a linear motor, and drives the mask stage 135 in the X-, Y-, and Z-axis directions and the rotation directions about the respective axes. Note that the scanning direction of the mask 130 or wafer 150 on its surface is defined as the Y-axis direction, a direction perpendicular to it is defined as the X-axis direction, and a direction perpendicular to the surface of the mask 130 or wafer 150 is defined as the Z-axis direction.

The projection optical system 140 projects the circuit pattern of the mask 130 onto the wafer 150. The projection optical system 140 can be a dioptric system, catadioptric system, or catoptric system. The final lens (final surface) of the projection optical system 140 is coated with a coating for reducing the influence on it exerted by the liquid LW supplied from the liquid supply/recovery unit 160 (for protection).

The wafer 150 is a substrate onto which the circuit pattern of the mask 130 is projected (transferred). However, the wafer 150 can be substituted by a glass plate or another substrate. The wafer 150 is coated with a resist.

The wafer stage 155 supports the wafer 150 and moves it in the X-, Y-, and Z-axis directions and the rotation directions about the respective axes using a linear motor, like the mask stage 135.

The liquid supply/recovery unit 160 has a function of supplying the liquid LW to the space between the wafer 150 and the final lens (final surface) of the projection optical system 140. The liquid supply/recovery unit 160 also has a function of recovering the liquid LW supplied to the space between the wafer 150 and the final lens of the projection optical system 140. A substance which has a high transmittance with respect to the exposure light, prevents dirt from adhering on the projection optical system 140 (on its final lens), and matches the resist process is selected as the liquid LW.

The main control system 170 includes a CPU and memory and controls the operation of the exposure apparatus 100. For example, the main control system 170 is electrically connected to the mask stage 135, wafer stage 155, and liquid supply/recovery unit 160, and controls the synchronous scanning between the mask stage 135 and the wafer stage 155. The main control system 170 also controls the switching among the supply, recovery, and supply/recovery stop of the liquid LW, based on, e.g., the scanning direction and velocity of the wafer stage 155 in exposure. The main control system 170 performs this control especially based on information input from a monitor and input device, and that from the illumination device. For example, the main control system 170 controls the driving of the aperture stop 125 via a driving mechanism. Information on control by the main control system 170 and other information are displayed on the monitor and the monitor of the input device. The main control system 170 receives information on an effective source according to one of the above-described embodiments, and controls, e.g., the aperture stop, diffractive optical element, and prism, thereby forming an effective source.

In exposure, a light beam emitted by the light source 110 illuminates the mask 130 by the illumination optical system 120. The light beam which reflects the circuit pattern of the mask 130 upon being transmitted through it forms an image on the wafer 150 via the liquid LW by the projection optical system 140. The exposure apparatus 100 has an excellent imaging performance and can provide devices (e.g., a semiconductor device, an LCD device, an image sensing device (e.g., a CCD), and a thin-film magnetic head) with high throughput and a good economical efficiency. These devices are fabricated by a step of exposing a substrate (e.g., a wafer or glass plate) coated with a resist (photosensitive agent) using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-242911 filed on Sep. 19, 2007, and 2008-041489 filed on Feb. 22, 2008, which are hereby incorporated by reference herein in their entirety.

What is claimed is:

1. A generation method of generating, by a computer, data of a mask used for an exposure apparatus which comprises an illumination optical system which illuminates the mask with light from a light source, and a projection optical system which projects a pattern of the mask onto a substrate, comprising:

an obtaining step of obtaining a two-dimensional transmission cross coefficient based on a function describing a light intensity distribution formed on a pupil plane of the projection optical system by the illumination optical system and a pupil function of the projection optical system;

an aerial image calculation step of calculating an approximate aerial image formed on an image plane of the projection optical system, based on the two-dimensional transmission cross coefficient and a pattern existing on an object plane of the projection optical system;

a two-dimensional image extraction step of extracting a two-dimensional image from the approximate aerial image calculated in the aerial image calculation step;

a main pattern determination step of determining a main pattern of the mask based on the two dimensional image extracted in the two-dimensional image extraction step, deforming a shape of the main pattern;

a peak portion extraction step of extracting, from the approximate aerial image calculated in the aerial image calculation step, a peak portion at which a light intensity takes a peak value in a region other than a region in which the main pattern is projected onto the image plane;

an assist pattern determination step of determining an assist pattern based on the light intensity of the peak portion extracted in the peak portion extraction step; and a generation step of inserting the assist pattern determined in the assist pattern determination step into a portion of the mask, which corresponds to the peak portion extracted in the peak portion extraction step, thereby generating, as the data of the mask, pattern data including the assist pattern and the main pattern determined in the main pattern determination step.

2. A generation method of generating, by a computer, data of a mask used for an exposure apparatus which comprises an illumination optical system which illuminates the mask with light from a light source, and a projection optical system which projects a pattern of the mask onto a substrate, comprising:

an aerial image calculation step of calculating an aerial image formed on an image plane of the projection optical system, based on information associated with a light intensity distribution formed on a pupil plane of the projection optical system by the illumination optical system, information associated with a wavelength of the light from the light source, information associated with a numerical aperture of the projection optical system on a side of the image plane thereof, and a target pattern to be formed on the substrate;

a two-dimensional image extraction step of extracting a two-dimensional image from the aerial image calculated in the aerial image calculation step;

a main pattern determination step of determining a main pattern of the mask based on the two-dimensional image extracted in the two-dimensional image extraction step;

a peak portion extraction step of extracting, from the aerial image calculated in the aerial image calculation step, a peak portion at which a light intensity takes a peak value in a region other than a region in which the main pattern is projected onto the image plane;

an assist pattern determination step of determining an assist pattern based on the light intensity of the peak portion extracted in the peak portion extraction step; and a generation step of inserting the assist pattern determined in the assist pattern determination step into a portion of the mask, which corresponds to the peak portion extracted in the peak portion extraction step, thereby generating, as the data of the mask, pattern data including the assist pattern and the main pattern determined in the main pattern determination step, wherein in the main pattern determination step, the main pattern is deformed until a difference between the two-dimensional image and the target pattern falls within an allowance.

3. The method according to claim 2, wherein one of a light intensity of the aerial image, an NILS, and a line width is used as an evaluation value for the difference between the two-dimensional image and the target pattern.

4. A generation method of generating, by a computer, data of a mask used for an exposure apparatus which comprises an illumination optical system which illuminates the mask with light from a light source, and a projection optical system which projects a pattern of the mask onto a substrate, comprising:

an aerial image calculation step of calculating an aerial image formed on an image plane of the projection optical system, based on information associated with a light intensity distribution formed on a pupil plane of the projection optical system by the illumination optical system, information associated with a wavelength of the light from the light source, information associated with a numerical aperture of the projection optical system on a side of the image plane thereof, and a target pattern to be formed on the substrate;

a two-dimensional image extraction step of extracting a two-dimensional image from the aerial image calculated in the aerial image calculation step;

a main pattern determination step of determining a main pattern of the mask based on the two-dimensional image extracted in the two-dimensional image extraction step;

a peak portion extraction step of extracting, from the aerial image calculated in the aerial image calculation step, a peak portion at which a light intensity takes a peak value in a region other than a region in which the main pattern is projected onto the image plane;

an assist pattern determination step of determining an assist pattern based on the light intensity of the peak portion extracted in the peak portion extraction step; and a generation step of inserting the assist pattern determined in the assist pattern determination step into a portion of the mask, which corresponds to the peak portion extracted in the peak portion extraction step, thereby generating, as the data of the mask, pattern data including the assist pattern and the main pattern determined in the main pattern determination step, wherein in the assist pattern determination step, if the target pattern is a light-transmitting pattern, a size of the assist pattern is determined based on a ratio between a maximum value of a light intensity of the main pattern, and a maximum value of a light intensity of a region other than a region in which the main pattern is projected onto the substrate, and if the target pattern is a light-shielding pattern, the size of the assist pattern is determined based on a ratio between a difference between a light intensity of a background and a minimum value of the light intensity of the main pattern, and a difference between the light intensity of the background and a minimum value of the light intensity of the region other than the region in which the main pattern is projected onto the substrate.

5. A generation method of generating, by a computer, data of a mask used for an exposure apparatus which comprises an illumination optical system which illuminates the mask with light from a light source, and a projection optical system which projects a pattern of the mask onto a substrate, comprising:

an aerial image calculation step of calculating an aerial image formed on an image plane of the projection optical system, based on information associated with a light intensity distribution formed on a pupil plane of the projection optical system by the illumination optical system, information associated with a wavelength of the light from the light source, information associated with a numerical aperture of the projection optical system on a side of the image plane thereof, and a target pattern to be formed on the substrate;

a two-dimensional image extraction step of extracting a two-dimensional image from the aerial image calculated in the aerial image calculation step;

a main pattern determination step of determining a main pattern of the mask based on the two-dimensional image extracted in the two-dimensional image extraction step;

a peak portion extraction step of extracting, from the aerial image calculated in the aerial image calculation step, a peak portion at which a light intensity takes a peak value in a region other than a region in which the main pattern is projected onto the image plane;

an assist pattern determination step of determining an assist pattern based on the light intensity of the peak portion extracted in the peak portion extraction step; and a generation step of inserting the assist pattern determined in the assist pattern determination step into a portion of the mask, which corresponds to the peak portion extracted in the peak portion extraction step, thereby generating, as the data of the mask, pattern data including the assist pattern and the main pattern determined in the main pattern determination step, wherein in the peak portion extraction step, a second derivative of the aerial image calculated in the aerial image calculation step is calculated, and the peak portion is extracted based on the obtained second derivative.

6. A generation method of generating, by a computer, data of a mask used for an exposure apparatus which comprises an illumination optical system which illuminates the mask with light from a light source, and a projection optical system which projects a pattern of the mask onto a substrate, comprising:

an obtaining step of obtaining a two-dimensional transmission cross coefficient based on a function describing a light intensity distribution formed on a pupil plane of the projection optical system by the illumination optical system and a pupil function of the projection optical system;

a first aerial image calculation step of calculating an approximate aerial image formed on an image plane of the projection optical system, based on the two-dimensional transmission cross coefficient and a pattern existing on an object plane of the projection optical system;

a first two-dimensional image extraction step of extracting a two-dimensional image from the approximate aerial image calculated in the first aerial image calculation step;

a first main pattern determination step of determining a main pattern of the mask based on the two dimensional image extracted in the first two-dimensional image extraction step, deforming a shape of the main pattern;

a first peak portion extraction step of extracting, from the approximate aerial image calculated in the first aerial image calculation step, a peak portion at which a light intensity takes a peak value in a region other than a region in which the main pattern is projected onto the image plane;

a first assist pattern determination step of determining an assist pattern based on the light intensity of the peak portion extracted in the first peak portion extraction step;

a second aerial image calculation step of calculating an approximate aerial image formed on the image plane of the projection optical system, based on a pattern including the main pattern determined in the first main pattern determination step and the assist pattern which is determined in the first assist pattern determination step and inserted at a portion of the mask, which corresponds to the peak portion extracted in the first peak portion extraction step, and the two-dimensional transmission cross coefficient;

a second two-dimensional image extraction step of extracting a two-dimensional image from the approximate aerial image calculated in the second aerial image calculation step;

a second main pattern determination step of determining a main pattern of the mask based on the two dimensional image extracted in the second two-dimensional image extraction step, deforming a shape of the main pattern;

a second peak portion extraction step of extracting, from the approximate aerial image calculated in the second aerial image calculation step, a peak portion at which a light intensity takes a peak value in a region other than a region in which the main pattern is projected onto the image plane;

a second assist pattern determination step of determining an assist pattern based on the light intensity of the peak portion extracted in the second peak portion extraction step; and a generation step of inserting the assist pattern determined in the second assist pattern determination step into a portion of the mask, which corresponds to the peak portion extracted in the second peak portion extraction step, thereby generating, as the data of the mask, pattern data including the assist pattern and the main pattern determined in the second main pattern determination step.

7. A mask fabrication method comprising fabricating a mask based on data generated by a generation method according to claim 1.

8. A mask fabrication method comprising fabricating a mask based on data generated by a generation method according to claim 6.

9. An exposure method comprising steps of:
fabricating a mask by a mask fabrication method according to claim 7;
illuminating the fabricated mask; and
projecting an image of a pattern of the mask onto a substrate via a projection optical system.

10. An exposure method comprising steps of:
fabricating a mask by a mask fabrication method according to claim 8;
illuminating the fabricated mask; and
projecting an image of a pattern of the mask onto a substrate via a projection optical system.

11. A device fabrication method comprising steps of:
exposing a substrate using an exposure method according to claim 9; and
performing a development process for the substrate exposed.

12. A device fabrication method comprising steps of:
exposing a substrate using an exposure method according to claim 10; and
performing a development process for the substrate exposed.

13. A storage medium which stores a program for making a computer generate data of a mask used for an exposure apparatus which comprises an illumination optical system which illuminates the mask with light from a light source, and a projection optical system which projects a pattern of the mask onto a substrate, the medium making the computer execute:

an obtaining step of obtaining a two-dimensional transmission cross coefficient based on a function describing a light intensity distribution formed on a pupil plane of the projection optical system by the illumination optical system and a pupil function of the projection optical system;

an aerial image calculation step of calculating an approximate aerial image formed on an image plane of the projection optical system, based on the two-dimensional transmission cross coefficient and a pattern existing on an object plane of the projection optical system;

a two-dimensional image extraction step of extracting a two-dimensional image from the approximate aerial image calculated in the aerial image calculation step;

a main pattern determination step of determining a main pattern of the mask based on the two dimensional image extracted in the two-dimensional image extraction step, deforming a shape of the main pattern;

a peak portion extraction step of extracting, from the approximate aerial image calculated in the aerial image calculation step, a peak portion at which a light intensity takes a peak value in a region other than a region in which the main pattern is projected onto the image plane;

an assist pattern determination step of determining an assist pattern based on the light intensity of the peak portion extracted in the peak portion extraction step; and a generation step of inserting the assist pattern determined in the assist pattern determination step into a portion of the mask, which corresponds to the peak portion extracted in the peak portion extraction step, thereby generating, as the data of the mask, pattern data including the assist pattern and the main pattern determined in the main pattern determination step.

14. A storage medium which stores a program for making a computer generate data of a mask used for an exposure apparatus which comprises an illumination optical system which illuminates the mask with light from a light source, and a projection optical system which projects a pattern of the mask onto a substrate, the medium making the computer execute:

an obtaining step of obtaining a two-dimensional transmission cross coefficient based on a function describing a light intensity distribution formed on a pupil plane of the projection optical system by the illumination optical system and a pupil function of the projection optical system;

a first aerial image calculation step of calculating an approximate aerial image formed on an image plane of the projection optical system, based on the two-dimensional transmission cross coefficient and a pattern existing on an object plane of the projection optical system;

a first two-dimensional image extraction step of extracting a two-dimensional image from the approximate aerial image calculated in the first aerial image calculation step;

a first main pattern determination step of determining a main pattern of the mask based on the two dimensional image extracted in the first two-dimensional image extraction step, deforming a shape of the main pattern;

a first peak portion extraction step of extracting, from the approximate aerial image calculated in the first aerial image calculation step, a peak portion at which a light intensity takes a peak value in a region other than a region in which the main pattern is projected onto the image plane;

a first assist pattern determination step of determining an assist pattern based on the light intensity of the peak portion extracted in the first peak portion extraction step;

a second aerial image calculation step of calculating an approximate aerial image formed on the image plane of the projection optical system, based on a pattern including the main pattern determined in the first main pattern determination step and the assist pattern which is determined in the first assist pattern determination step and inserted at a portion of the mask, which corresponds to the peak portion extracted in the first peak portion extraction step, and the two-dimensional transmission cross coefficient;

a second two-dimensional image extraction step of extracting a two-dimensional image from the approximate aerial image calculated in the second aerial image calculation step;

a second main pattern determination step of determining a main pattern of the mask based on the two dimensional image extracted in the second two-dimensional image extraction step, deforming a shape of the main pattern;

a second peak portion extraction step of extracting, from the approximate aerial image calculated in the second aerial image calculation step, a peak portion at which a light intensity takes a peak value in a region other than a region in which the main pattern is projected onto the image plane;

a second assist pattern determination step of determining an assist pattern based on the light intensity of the peak portion extracted in the second peak portion extraction step; and a generation step of inserting the assist pattern determined in the second assist pattern determination step into a portion of the mask, which corresponds to the peak portion extracted in the second peak portion extraction step, thereby generating, as the data of the mask, pattern data including the assist pattern and the main pattern determined in the second main pattern determination step.

* * * * *